(12) United States Patent
Adachi et al.

(10) Patent No.: US 8,248,562 B2
(45) Date of Patent: Aug. 21, 2012

(54) DISPLAY PANEL HAVING AN ANTIREFLECTION LAYER

(75) Inventors: Masaya Adachi, Hitachi (JP); Makiko Sugibayashi, Hitachi (JP); Tetsuya Ohshima, Mobara (JP); Shinichi Komura, Mobara (JP)

(73) Assignees: Hitachi Displays, Ltd., Chiba-ken (JP); Panasonic Liquid Crystal Display Co., Ltd., Hyogo-ken (JP)

( * ) Notice: Subject to any disclaimer, the term of this patent is extended or adjusted under 35 U.S.C. 154(b) by 412 days.

(21) Appl. No.: 11/510,619

(22) Filed: Aug. 28, 2006

(65) Prior Publication Data

US 2007/0053063 A1 Mar. 8, 2007

(30) Foreign Application Priority Data

Sep. 2, 2005 (JP) .................. 2005-254306

(51) Int. Cl.
*G02F 1/1335* (2006.01)
*G02F 1/1345* (2006.01)
*G02F 1/1333* (2006.01)
*G02B 27/00* (2006.01)
*C09K 19/00* (2006.01)

(52) U.S. Cl. ........ 349/137; 349/150; 349/158; 359/601; 428/1.1

(58) Field of Classification Search .................. 349/137, 349/150, 158; 359/601; 428/1
See application file for complete search history.

(56) References Cited

U.S. PATENT DOCUMENTS

| | | | | |
|---|---|---|---|---|
| 3,736,047 A * | 5/1973 | Gelber et al. | ................. | 349/137 |
| 4,753,516 A * | 6/1988 | Doi et al. | ...................... | 359/609 |
| 4,765,729 A * | 8/1988 | Taniguchi | ..................... | 351/163 |
| 5,018,835 A * | 5/1991 | Dorschner | .................... | 349/140 |
| 5,838,404 A * | 11/1998 | Ozeki et al. | ..................... | 349/65 |
| 5,871,843 A * | 2/1999 | Yoneda et al. | ................ | 428/337 |
| 5,880,557 A * | 3/1999 | Endo et al. | ..................... | 313/461 |
| 6,251,523 B1 * | 6/2001 | Takahashi et al. | ............ | 428/428 |
| 6,307,528 B1 * | 10/2001 | Yap | ................................. | 345/45 |
| 6,369,867 B1 * | 4/2002 | Ge | ................................. | 349/73 |
| 6,437,846 B1 * | 8/2002 | Ono et al. | ..................... | 349/149 |
| 2004/0114248 A1 * | 6/2004 | Hokazono et al. | ............ | 359/603 |
| 2005/0195486 A1 | 9/2005 | Sasaki et al. | | |
| 2005/0259208 A1 * | 11/2005 | Miki et al. | ..................... | 349/149 |

FOREIGN PATENT DOCUMENTS

| | | | |
|---|---|---|---|
| JP | 05-203939 | | 8/1993 |
| JP | 05203939 A | * | 8/1993 |
| JP | 07-092305 | | 4/1995 |
| JP | 07-306400 | | 11/1995 |
| JP | 2000-214424 | | 8/2000 |
| JP | 2001-230396 | | 8/2001 |
| JP | 2001-281412 | | 10/2001 |

(Continued)

*Primary Examiner* — Mark Robinson
*Assistant Examiner* — Paisley L Arendt
(74) *Attorney, Agent, or Firm* — Antonelli, Terry, Stout & Kraus, LLP.

(57) ABSTRACT

Provided is a display panel having a high-performance antireflection layer at a low cost.

In a liquid crystal display panel or an organic light-emitting diode display panel constituted by a first transparent substrate, a second transparent substrate and a liquid crystal layer between these two transparent substrates further includes an antireflection layer on a portion which is at least one display area and a visible side (outer surface) by a viewer, and layers made of the same material as the antireflection layer formed on at least the opposite side (inside surface) of the surface of the portion corresponding to the display area and on three edge faces.

17 Claims, 17 Drawing Sheets

FOREIGN PATENT DOCUMENTS

| | | |
|---|---|---|
| JP | 2002-079600 | 3/2002 |
| JP | 2003-029022 | 1/2003 |
| JP | 2003-201443 | 7/2003 |
| JP | 2004-083307 | 3/2004 |
| JP | 2005-043810 | 2/2005 |

* cited by examiner

DISPLAY PANEL HAVING AN ANTIREFLECTION LAYER

CLAIM OF PRIORITY

The present application claims priority from Japanese Application JP 2005-254306 filed on Sep. 2, 2005, the content of which is hereby incorporated by reference into this application.

FIELD OF THE INVENTION

The present invention relates to a liquid crystal display panel provided with an antireflection layer, a liquid crystal display device incorporated with the liquid crystal display panel and a backlight device or an organic EL (electroluminescence) display device provided with an antireflection layer, and an electrical appliance using the same.

BACKGROUND OF THE INVENTION

Portable equipment such as a cell phone or PDA (personal digital assistant), by its nature, requires a thin, light display device. Frequently used display device therefor is a liquid crystal display device or an organic light emitting diode display device (hereinafter referred to as 'OLED display device'). In general, a liquid crystal display device realizes display incorporating a liquid crystal display panel forming an image by controlling transmittance or reflectance of light, and a backlight device and a front light device as a light source. In addition, the OLED display device can realize display without incorporating a separate light source because the OLED display panel itself emits an image light.

When the display device is seen in a bright environment, the surface of the screen reflects ambient light so that an image on the screen is sometimes not easily visible. Because of this, the screen nowadays has an antireflection layer to control the reflection of ambient light.

Multi-layer films as well as single-layer films are used as antireflection layers. The antireflection layer with a multi-layer structure is realized by alternately layering films having a high refractive index and films having a low refractive index by deposition methods such as evaporation, sputtering or ion plating. Although excellent reflection prevention is achieved, its manufacturing cost is high.

On the other hand, the single-layer film is formed of a single coating layer and thus a reduced number of processes are required, leading to a low-cost manufacturing process. However, improvement of antireflection performance is still required.

In case of the single-layer film, its refractive index R' can be expressed by the formula below, in which $n_0$ denotes refractive index of an outside medium, $n_1$ denotes refractive index of the surface of a display device, and $n_2$ denotes refractive index of the antireflection layer.

$$R'=\{(n_2^2-n_0\times n_1)/(n_2^2+n_0\times n_1)\}^2 \quad (1)$$

Here, the outside medium is typically air and its refractive index, $n_0$, is usually 1.0. Thus, the refractive index R' can be expressed as:

$$R'=\{(n_2^2-n_1)/(n_2^2+n_1)\}^2 \quad (2)$$

When $n_2=\sqrt{n_1}$, theoretically, reflectance becomes 0%.

A proper refractive index of the antireflection layer is about 1.22 because the refractive index of the surface of a display is typically 1.5. At present state, however, a fluorine-series resin known to have a low refractive index has the refractive index of 1.34, so it is very difficult to get a sufficient antireflection performance from the single layer antireflection layer containing a fluorine-series resin.

In recent years, methods for lowering refractive index of a single-layer film have been suggested and a thin film disclosed in Japanese Patent Laid-Open No. 2003-201443 is one of them. This thin film essentially comprises microparticles having an internal cavity (hollow microparticles) and a binder for protecting and retaining the hollow microparticles. Because the internal cavity of the thin film has substantially the same refractive index with air ($n_{air}$=1.0), even though the material of the hollow microparticles or the binder for protecting and retaining the hollow microparticles may have a large refractive index, refractive index from the viewpoint of the film is very close to the refractive index of air. That is to say, by forming a substrate with this film, reflectance of the device can be lowered.

Another example of such methods for lowering the refractive index of a single-layer film is by employing a film with a low refractive index as disclosed in Japanese Patent Laid-Open No. H7-92305. According to this technique, the surfaces of the organic ultrafine microparticles on the side near to air are exposed and a rugged film is formed on the surface, lowering density on the surface, and resultantly forming a low refractive index film.

Still another example of such methods is employing a low refractive index film having honeycomb structured pores as disclosed in Japanese Patent Laid-Open No. 2004-83307. According to this patent document, a plurality of honeycomb-structured pores capable of penetrating silica particles are formed in parallel to each other. As a result, a maximum void ratio can be obtained without deteriorating strength of the silica particle itself. Therefore, a low refractive index film having superior mechanical strength can be manufactured.

SUMMARY OF THE INVENTION

When the thin film of Japanese Patent Laid-Open No. 2003-201443 is put to practical use to decrease the refractive index, it is necessary to increase the void ratio, which in turn deteriorates the mechanical strength of the film.

Even though the film disclosed in Japanese Patent Laid-Open No. H7-92305 or Japanese Patent Laid-Open No. 2004-83307 exhibits a relatively high mechanical strength by crosslinking or polymerization, it is very difficult to remove contaminants stuck in the rugged surface of the film, resulting in a high refractive index. Moreover, with these constitutions, it is hard to realize an ideal refractive index (refractive index of a frequently used substrate is approximately 1.5, but in these cases it is approximately 1.22) for the antireflection layer composed of a single-layer film.

The above-described conventional technologies are based on the same condition that the antireflection layer is coated onto a plate-shaped or a film-shaped substrate and fails to suggest coating the antireflection layer directly onto a display panel.

To solve the foregoing problems of the conventional technologies, it is therefore an object of the present invention to realize a cost-effective display device or an electrical appliance using the same by forming a layer with excellent reflection prevention performance directly on a display panel. Further, the present invention is directed to realize a display device of high cost-performance by adding other functions in addition to the antireflection function.

Additional objects and novel features of the invention will be set forth in the description and drawings which follow.

To achieve the aforementioned objects of the invention, the following means are employed.

The present invention provides a liquid crystal display panel having a first transparent substrate, a second transparent substrate, and a liquid crystal layer sandwiched therebetween further including an antireflection layer on a portion which is at least one display area and a visible side (outer surface) by a viewer, and layers made of the same material as the antireflection layer formed on at least the opposite side (inside surface) of the surface of the portion corresponding to the display area and on three edge faces.

In addition, the present invention provides an organic light-emitting diode display panel (hereinafter referred to as OLED display panel), comprising a substrate with light emitting elements forming a plurality of pixels arranged in a matrix and a sealing means, wherein the organic light-emitting diode display panel further comprises an antireflection layer on a portion which is at least one display area and a visible side (outer surface) by a viewer, and layers made of the same material as the antireflection layer formed on at least the opposite side (inside surface) of the surface of the portion corresponding to the display area and on three edge faces.

In addition, as a layer composing the antireflection layer, a layer having a surface resistance of less than $10^{11}\Omega$ is adopted.

In this OLED display, the connection of an electric signal such as an image signal with the outside is executed in a predetermined direction, and layers made of the same material as the antireflection layer are formed on surfaces other than the edge faces in that direction and the outer surface.

In addition, the present invention provides a liquid crystal display panel, comprising a first transparent substrate, a second transparent substrate, and a liquid crystal layer sandwiched therebetween, wherein the second transparent substrate is larger in area than the first transparent substrate and has a display area in an area overlapped with the first transparent substrate, and a planarization layer for planarizing the height on the other side of the first transparent substrate not facing the second transparent substrate, in which the planarization layer is formed on at least a portion of the surface of the second transparent substrate facing the first transparent substrate and not overlapped with the first transparent substrate; and wherein, the liquid crystal display panel comprises an antireflection layer formed on the display area which is at least a part of the planarization layer and a visible side (outer surface) by a viewer, and layers made of the same material as the antireflection layer formed on at least the opposite side (inside surface) of the surface of the portion corresponding to the display area and on three edge faces.

In addition, unless otherwise explained, the size of an area in the specification means the size of a projected area seen from the direction of a viewer in front of the display panel.

In addition, the present invention provides a liquid crystal display panel, comprising a first transparent substrate, a second transparent substrate and a liquid crystal layer sandwiched therebetween, wherein the first transparent substrate has a first optical layer having at least one polarizing layer deposited on the opposite surface thereof not facing the second transparent substrate, the second transparent substrate has a second optical layer having at least one polarizing layer deposited on the opposite surface thereof not facing the first transparent substrate, and the second transparent substrate is larger in area than the first transparent substrate and has a display area in an area overlapped with the first transparent substrate; wherein, a first planarization layer for planarizing the height on the other side of the first optical layer not facing the first transparent substrate is formed on at least a portion of the surface of the second transparent substrate facing the first transparent substrate which is not overlapped with the first transparent substrate, and a second planarization layer for planarizing the height on the other side of the second optical layer not facing the second transparent substrate is formed on at least a portion of the surface of the second transparent substrate not facing the first transparent substrate which is not overlapped with the first transparent substrate; and wherein, the liquid crystal display panel comprises an antireflection layer formed on the display area which is at least a portion of the first or second planarization layer and a visible side (outer surface) by a viewer, and layers made of the same material as the antireflection layer formed on at least the opposite side (inside surface) of the surface of the portion corresponding to the display area and on three edge faces.

In addition, the present invention provides an OLED display panel, comprising a substrate with light emitting elements forming a plurality of pixels arranged in a matrix and a sealing means wherein the substrate with light emitting elements is larger in area than the sealing means and has a display area in an area overlapped with the sealing means, and a planarization layer for planarizing the height on the other side of the sealing means not facing the substrate with light emitting elements, in which the planarization layer is formed on at least a portion of the surface of the substrate with light emitting elements facing the sealing means and not overlapped with the sealing means; and wherein, the OLED display panel comprises an antireflection layer formed on the display area which is at least a part of the planarization layer and a visible side (outer surface) by a viewer, and layers made of the same material as the antireflection layer formed on at least the opposite side (inside surface) of the surface of the portion corresponding to the display area and on three edge faces.

In addition, the present invention provides an OLED display panel, comprising a substrate with light emitting elements forming a plurality of pixels arranged in a matrix and a sealing means, wherein an image light is out-coupled from a side of the substrate with light emitting elements. The OLED panel further includes an optical layer having at least one polarizing layer deposited on the opposite surface thereof not facing the sealing means, and a planarization layer for planarizing the height on the other side of the substrate with light emitting elements of the optical film, in which the planarization layer is formed on at least a portion of the surface of the substrate with light emitting elements not facing the sealing means and not overlapped with a light emitting layer; and wherein the OLED display panel has an antireflection layer formed on the display area which is at least a part of the planarization layer and a visible side (outer surface) by a viewer, and layers made of the same material as the antireflection layer formed on at least the opposite side (inside surface) of the surface of the portion corresponding to the display area and on three edge faces.

In addition, in the above-described liquid crystal display panel, an electrode forming a plurality of pixels arranged in a matrix exists on a second transparent substrate, and an area connecting an electrical signal including an image signal to the outside, in which the connection of an electric signal to the outside is executed in a predetermined direction, is also used as an area where a planarization layer is deposited.

In addition, in the above-described OLED display panel, an area connecting an electrical signal including an image signal to the outside is formed on a substrate having light emitting elements, in which the connection of an electric signal with the outside is executed in a predetermined direction, and the area connecting an electric signal to the outside is also used as an area where a planarization layer is deposited.

In addition, the present invention provides a liquid crystal display panel, comprising a first transparent substrate, a second transparent substrate and a liquid crystal layer sandwiched therebetween, wherein the first transparent substrate has a first optical film having at least one polarizing layer deposited on the opposite surface thereof not facing the second transparent substrate, the second transparent substrate has a second optical film having at least one polarizing layer deposited on the opposite surface thereof not facing the first transparent substrate, and the second transparent substrate is larger in area than the first transparent substrate and has a display area in an area overlapped with the first transparent substrate; wherein, the first optical film and the second optical film are larger in area than the first transparent substrate and cover a part of the surface of the second transparent substrate which is not overlapped with the first transparent substrate; and wherein the liquid crystal display further comprises an antireflection layer formed on the display area which is at least a portion of the first or second optical film, at least a portion of the surface of the second transparent substrate that is not overlapped with the first transparent substrate and a visible side (outer surface) by a viewer, and layers made of the same material as the antireflection layer formed on at least the opposite side (inside surface) of the surface of the portion corresponding to the display area and on three edge faces.

In addition, the present invention provides an OLED display panel, comprising a substrate with light emitting elements forming a plurality of pixels arranged in a matrix and a sealing means, wherein an optical film having at least one polarizing layer is formed on a top-most surface of the light-coupling side of the substrate with light emitting elements or the sealing means, wherein the substrate with light emitting elements is larger in area than the sealing means and has a display area in an overlapped area with the sealing means; wherein the optical film is larger in area than the sealing means and covers at least a portion of the area of the substrate not overlapped with the sealing means; and wherein the OLED display panel further comprises an antireflection layer formed on the display area of the optical film, at least a portion of the surface of the substrate that is not overlapped with the sealing means and a visible side (outer surface) by a viewer, and layers made of the same material as the antireflection layer formed on at least the opposite side (inside surface) of the surface of the portion corresponding to the display area and on three edge faces.

In addition, in the above-described liquid crystal display panel, an electrode forming a plurality of pixels arranged in a matrix exists on a second transparent substrate, and an area connecting an electrical signal including an image signal to the outside, in which the connection of an electric signal to the outside is executed in a predetermined direction, is overlapped with an expanded area of the optical film area.

In the case of the above-described OLED display panel, an area connecting an electrical signal including an image signal to the outside is formed on a substrate having light emitting elements, in which the connection of an electric signal with the outside is executed in a predetermined direction, and the area connecting an electric signal to the outside is overlapped with an expanded area of the optical film area.

In addition, the antireflection layer comprises inorganic oxide particles, a binder, and voids, and has an arithmetic mean roughness (Ra) on one side surface thereof is less than 6 nm.

According to another aspect of the present invention, the antireflection layer comprises inorganic oxide particles, a binder, and voids, and the binder contains the same material as the substrate as a main component.

Still another aspect of the present invention provides the antireflection layer which comprises inorganic oxide particles, a binder, and voids, and density of the void is higher at the interior of the layer than the surface of the layer coming in contact with air.

In addition, the present invention provides an electrical appliance having a display device which is constituted by a display panel, a transparent protection plate disposed on the front side, and an air layer between the display panel and the protection plate, wherein the protection plate is larger in area than a display area of the display panel, and the display device and the protection plate are fixed to a chassis, independently.

Other means except for the above will now be provided in the description as follows.

DETAILED DESCRIPTION OF THE PREFERRED EMBODIMENTS

According to the present invention, a display panel or display device having an excellent reflection prevention performance and further an electrical appliance equipped with the same can be realized.

BEST MODE FOR CARRYING OUT THE INVENTION

Although preferred embodiments of the invention are described in detail, many alternatives, modifications, and variations are possible. In addition, any combination of embodiments that follow is also included in the present invention.

1st Embodiment of Liquid Crystal Display Panel

Figure 1:
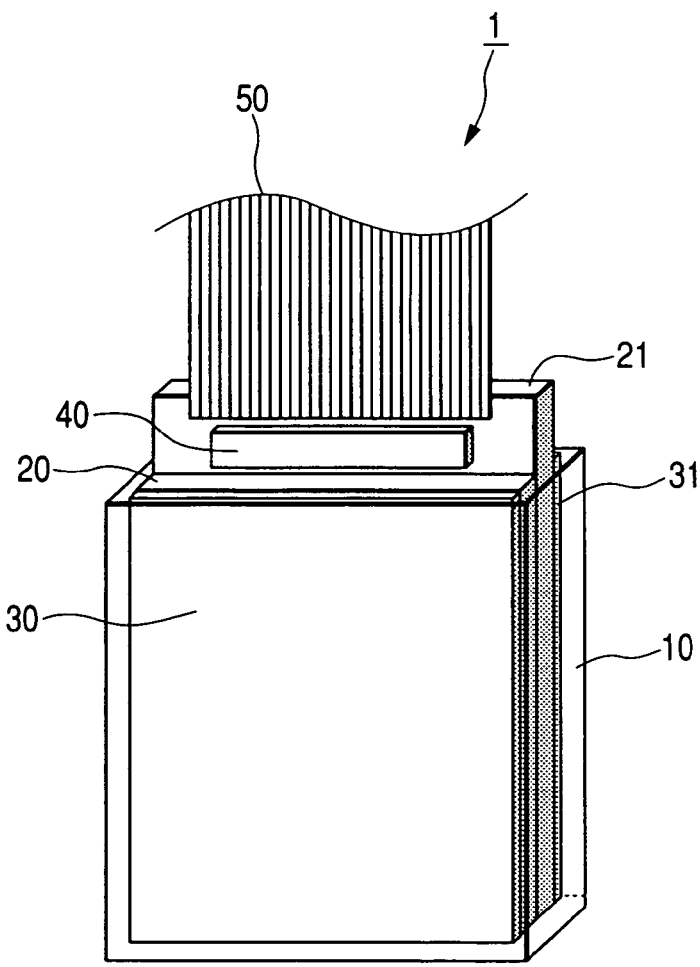
FIG. 1 is a schematic perspective view of a liquid crystal display panel according to the present invention.
Figure 2:
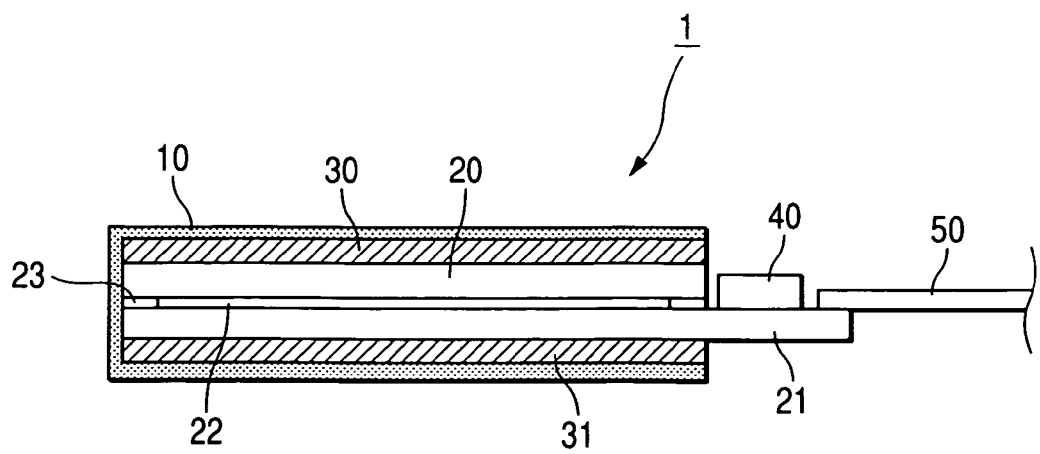
FIG. 2 is a schematic cross-sectional view of a liquid crystal display panel according to the present invention.

Preferred embodiments of a liquid crystal display panel of the present invention are explained in reference to accompanying drawings. FIGS. 1 and 2 are schematic and cross-sectional views of a liquid crystal display panel, respectively, according to a first preferred embodiment of the present invention.

A liquid crystal display panel 1 is a transmissive or a transflective-type liquid crystal display panel, which incorporates a backlight device to be explained later and displays an image by adjusting the amount of transmitted light from the backlight device. There are two types of driving methods for the liquid crystal display: a passive drive method and an active matrix drive method. Since detailed structures or operations thereof are already well known, explanations related to those will be omitted hereinafter.

A liquid crystal display panel displays an image by controlling the polarization status of an incident light onto a liquid crystal layer through a polarizer, and is favored over others because it can display high contrast images with a relatively low driving voltage. Such liquid crystal display panel operates, for example, in TN (Twisted Nematic) mode, STN (Super Twisted Nematic) mode, ECB (Electrical Controlled Birefringence) mode and the like. Moreover, the liquid crystal display can also be operated in IPS (In Plane Switching) mode and VA (Vertical Aligned) mode featuring a wide viewing angle.

As a liquid crystal display panel, a transflective-type liquid crystal display panel based on one of the above-described mode can be used.

Even though an active matrix liquid crystal display panel will be used for the description hereinafter, the present invention is not limited thereto.

The liquid crystal display panel 1 includes a first transparent substrate 20 and a second transparent substrate 21, each being made of flat, optically isotropic transparent glass or plastic.

A color filter or an alignment layer made from a polyimide series polymer (both are not shown) is laminated on the first transparent substrate 20. A switching element constituted by an electrode forming a plurality of pixels arranged in a matrix, a signal electrode, a scanning electrode and a thin film transistor and an alignment layer (all of these are not shown) are formed on the second transparent substrate 21.

The alignment layer formed surfaces of these two transparent substrates 20 and 21 are faced, spaced apart by a spacer (not shown) on the opposite sides, and a frame shaped seal material 23 is applied to their peripheral portions, creating a space (void) inside. A liquid crystal is then filled into this void and sealed to form a liquid crystal layer 22.

The direction of longitudinal alignment of the liquid crystal molecules is regulated by alignment treatment carried out on the alignment layers formed on the two transparent substrates 20 and 21.

A first optical film 30 and a second optical film 31 are deposited on the viewer side (outer surface) of the first transparent substrate 20 and the surface of the opposite side (inside surface) to the viewer side of the second transparent substrate 21, respectively.

Each of the first optical film 30 and the second optical film 31 has at least one polarizing layer or a proper phase difference layer depending on the liquid display mode applied. The polarizing layer transmits one component of a linearly polarized light among incident lights thereon while absorbing the other component orthogonal thereto. To produce the polarizing layer, a base film containing PVA (polyvinyl alcohol) stained or absorbed with dichroic materials such as iodine or organic dye is stretched and the dichroic materials are aligned thereon, revealing absorption dichroism. Then, two pieces of transparent protection films made of TAC (triacetyl cellulose) sandwich the base film from both sides.

As for the second optical film 31, a reflective polarizing film reflects a linear polarization component absorbed from the polarizing layer while transmitting the others. In this case, a brighter image is obtained as a less amount of light is absorbed by the polarizing layer.

The first optical film 30 and the second optical film 31 are fixed onto the first transparent substrate 20 and the second transparent substrate 21, respectively, through an adhesive layer (not shown) interposed therebetween.

The second transparent substrate has a larger area than the first transparent substrate and includes a display area forming a two-dimensional image by modulating the amount of light transmitted from the backlight device in an overlapped area of the first transparent substrate and the second transparent substrate. Moreover, the first optical film 30 and the second optical film 31 have a larger area than the display area so that the display area can be fully covered. At this time, it is important to make the first optical film 30 and the second optical film 31 have the same external shape and size or slightly smaller than the first transparent substrate or the second transparent substrate. In this way, the liquid crystal display panel does not necessarily have a large external shape and size and the antireflection layer can be uniformly or evenly thick within the display area.

Even though it is desirable to make the optical films larger in area than the display area as much as possible because the layer thickness of the antireflection layer on the edge portions of the optical films is not likely to be uniform, the optical films are still required to have the same external shape and size or smaller than the first transparent substrate or the second transparent substrate not to increase the external shape and size unnecessarily.

Unless otherwise explained, the term 'area' in the specification means a projected area seen from the direction of a viewer in front of the display panel.

The surface of the second transparent substrate 21 on the side of the first transparent substrate 20 has an area that is not covered by the first transparent substrate 20 and connects an electric signal such as an image signal to the outside. In detail, the liquid crystal display panel 1 has a flexible printed circuit (hereinafter referred to simply as FPC) 50 on a portion of the second transparent substrate 21, the portion not being overlapped with the first transparent substrate, and is electrically connected to the outside through this FPC (50). If necessary, a semiconductor chip 40 functioning as a driver may also be mounted.

The liquid crystal display panel 1 includes an antireflection layer 10 formed on at least the surface of the viewer (outer surface) of the first optical film covering the display area, and layers made of the same material as the antireflection layer, each layer being formed on the opposites surfaces (inside surface) to the display area, that is, the surface where the second optical film is deposited and two side surfaces (end faces on right and left sides) and the bottom surface (edge face at the bottom) of the liquid crystal display panel 1 in FIG. 1, respectively.

In this case, since layers of the same material are deposited on the outer surface and the inside surface of the liquid crystal display panel, even though the members constituting the display panel and the antireflection layer may have a different ratio of volume change by temperatures, they contract or expand equally on the outer and inside surfaces of the liquid crystal display panel, thereby suppressing deformation, e.g., warping, of the display panel.

In addition, since the edge faces of the substrates constituting the liquid crystal display panel are covered and protected by layers, minor cracks, leading to breakage, on the edge faces of thin glass substrates used for fabricating a thin liquid crystal display panel do not appear.

By employing a layer with less than $10^{11}\Omega$ of surface resistance for the antireflection layer, the display area as well as end portions or edge faces of the liquid crystal display panel are protected from adhesion of dust. An appropriate antireflection layer for the present invention will be explained in detail later.

Here, it is important that the liquid crystal display panel has a structure that the connection of an electric signal to the outside is executed in a predetermined direction. That is, the FPC 50 connects to one side of the rectangular liquid crystal display panel 1 when the display area is seen by the viewer in front of the display panel.

In such case, the FPC 50 is fixed to an area of the liquid crystal display panel, namely, a portion of the second transparent substrate not overlapped with the first transparent substrate, directly or by interposing proper equipment. Also, by coating the antireflection layer by a dip coating method it becomes possible to deposit the layers made of the same material as the antireflection layer onto the outer surface, inside surface and three edge faces of the liquid crystal display panel via a one-time process. In this manner, loss in coating materials is reduced and low-cost layers can be used.

Figure 3:
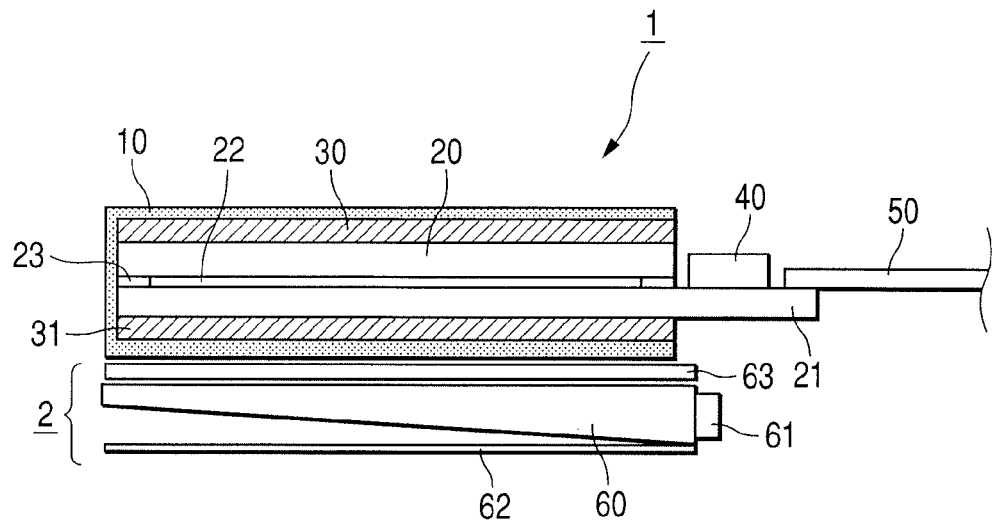
FIG. 3 is a schematic cross-sectional view of a liquid crystal display panel according to the present invention.

FIG. 3 is a schematic cross-sectional view of a liquid crystal display device provided with the liquid crystal display panel. As shown in the drawing, the liquid crystal display device is constituted by a liquid crystal display panel 1 and a backlight device 2 disposed at the rear side thereof. The backlight device 2 is for illuminating a display area of the liquid crystal display panel 1 from behind. The backlight device 2 may be operated in an edge light type backlighting system (light guide type backlight system) and a direct-type backlight system (reflective plate backlight system), or a planar-shaped light source backlight system can be used. Besides these examples, other systems can also be employed in consideration of purpose of the backlight device, size of the display area, etc. In the description hereinafter, however, the edge light-type backlighting system is used.

The backlight device 2 is constituted by a light guide plate 60 made from a transparent resin forming an optical path changing or prismatic means with, for example, a dot printing with white pigment on the inside surface or fine rugged surface or lens shape, capable of changing the path of a light; a light source 61 disposed at the edge face of the light guide plate 60, a reflector 62 disposed at the inside surface of the light guide plate 60, and an optical member 63, which is for example, a prism sheet, a microlens array or a diffusing sheet, disposed at the surface side.

Examples of the light source 61 include linear light sources such as a cold cathode fluorescent tube and a hot cathode fluorescent tube, or dot shape light sources such as light emitting elements (LEDs). In the description hereinafter, an LED will be used as the light source 61 but the present invention is not limited thereto.

In case of using an LED as the light source 61, a reflector (not shown) can be useful to make light from the light source incident on the light guide plate 60 more efficiently or an adequate mold resin configuration can be formed around a light emitting unit.

In this constitution, all lights from the light source 61 are incident on the light guide plate 60, reflected and propagated inside the light guide plate 60. Among the lights propagating inside the light guide plate 60, light that reaches the optical path changing means inside the light guide plate 60 is deflected and emitted from the surface of the light guide plate 60. Then, the optical member, e.g., a prism sheet, microlens array or diffusing sheet, adjusts the emission angle distribution or the brightness distribution in the plane of the light emitted from the light guide plate 60 and radiates the light onto the liquid crystal display panel 1.

The liquid crystal display panel 1 forms an image by adjusting the amount of light transmitted from the backlight device 2 according to image data.

In such case, since the antireflection layers 10 are deposited on both surfaces of the liquid crystal display panel, not only can visibility be improved under the bright environment achieved by reducing the reflection of an external light but also brighter images can be realized thanks to the improved transmittance of the liquid crystal display panel. Moreover, by employing a layer having less than $10^{11}\Omega$ of surface resistance as the antireflection layer 10, the outer surface, side surfaces and inside surface of the liquid crystal display panel can be protected from adhesion of foreign substances. This consequently reduces defects in the device caused by foreign substances intruded between the backlight device and the liquid crystal display panel.

1st Embodiment of OLED Display Panel

Figure 4:
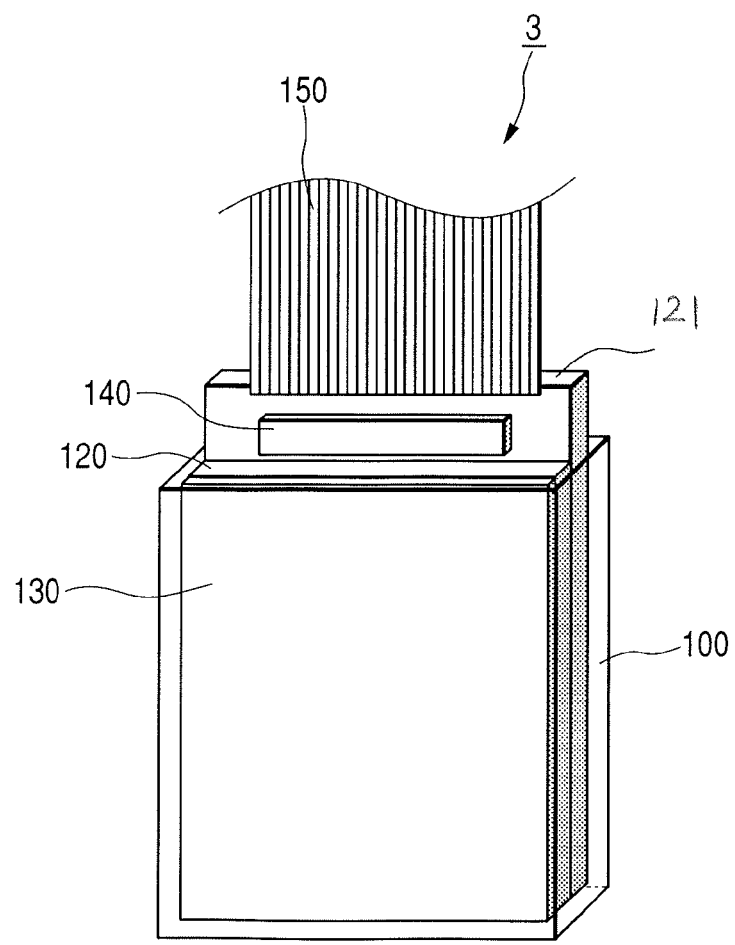
FIG. 4 is a schematic perspective view of an OLED display panel according to the present invention.

The following will now describe one embodiment of an OLED display panel according to the present invention with reference to accompanying drawings. FIG. 4 is a schematic perspective view of an OLED display panel in accordance with a first embodiment of the present invention, and FIGS. 5 and 6 respectively show cross sectional views of the OLED display panel of FIG. 4.

The OLED display panel 3, unlike the liquid crystal display panel, has a self light emitting element, so it does not require any supplementary light source like the backlight device to display an image. OLED display panels are categorized by two driving types: one is an active matrix drive type provided with a switching element such as a thin film transistor (hereinafter referred as a TFT) and the other is a passive matrix drive type that is driven by connecting an electrode forming an OLED element directly to a scanning line and a data line, respectively.

Although the description hereinafter will be based on the active matrix drive type OLED display panel, the present invention is not limited thereto.

The OLED display panel 3 includes a substrate 121 having organic light emitting elements forming a plurality of pixels arranged in a matrix, a sealing means 120 that is transparent at least to visible light, an optical film 130 deposited on the surface of the sealing means 120, an antireflection layer formed on a portion of a display area on the side of a viewer (outer surface), and layers which are made from the same material as the antireflection layer and deposited on at least the opposite surface (inside surface) to the surface of the display area.

Figure 5:
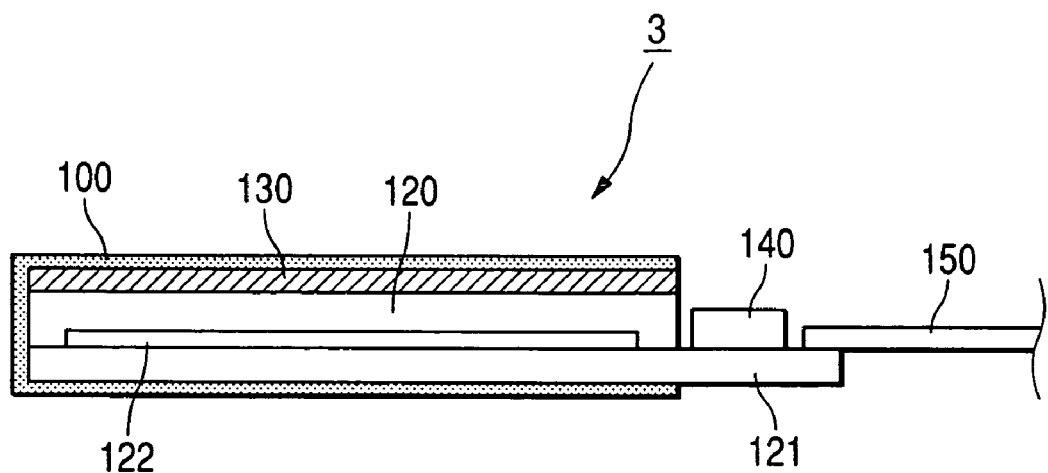
FIG. 5 is a schematic cross-sectional view of an OLED display panel according to the present invention.

In addition, the OLED display panel 3 is a top emission type OLED display panel out-coupling light from the opposite direction to the substrate 121 having the OLED formed thereon. In case of the top emission type, as shown in FIG. 5, a transparent seal plate being transparent to visible light and offering gas barrier property is used as the sealing means 120, which is then air tightly sealed to the substrate 121 by an adhesive seal member coated onto the periphery of the display area in a frame shape. Examples of such transparent seal plate include glass plates or gas barrier resin films, a lamination of a thin glass plate and a resin film and so forth.

In such case, a void 122 between the sealing means 120 and the substrate 121 is filled with a transparent medium with refractive index ranging 1.4 to 2.0, approximately, so as to reduce the difference in refractive index between the sealing unit 120 and the substrate 121. This is also for reducing the reflection from the interface between the void 122 and the sealing means 12.

Figure 6:
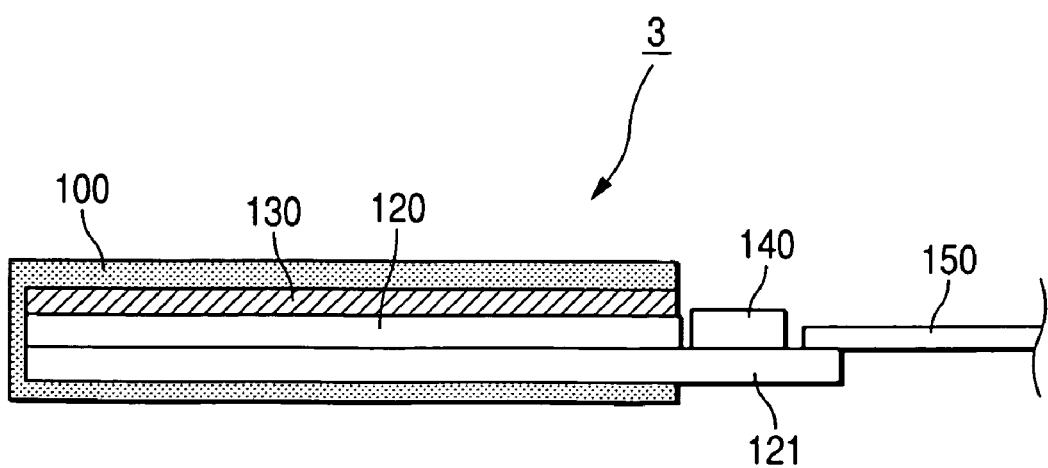
FIG. 6 is a schematic cross-sectional view of an OLED display panel according to the present invention.

Instead of using a transparent plate as the sealing means, as shown in FIG. 6, a laminate of inorganic transparent materials with the gas barrier property, or layers of inorganic transparent materials and organic transparent materials with the gas barrier property being alternately stacked repeatedly can be employed.

As for the LEDs forming pixels, organic light emitting elements can be used. The organic light emitting diode generally has a three-layered laminate structure consisting of an electrode functioning as an anode, an electrode functioning as a cathode, and a hole transporting layer, an emission layer and an electron transporting layer sequentially formed from the anode side between the electrodes. The present invention is, however, not limited thereto.

As for the substrate 121 having light emitting elements, an insulation substrate made of glass or plastic, or a substrate prepared by coating an insulating film onto a metal substrate with almost the same coefficient of thermal expansion as glass, such as, inver, may be used. The display area can be installed close to the center of the substrate 121 surrounded by a data-line driving circuit (not shown) and a scanning-line driving circuit (not shown). Examples of such driving circuits include shift register circuits (which are complementary N channel and P channel TFT circuits), level shifter circuits, analog switch circuits and the like.

A typical pixel driving circuit used in the active matrix driving type OLED display panel consists of two TFTs, that is, a switch transistor and a driver transistor, and storage capacity. The pixel driving circuit suppresses radiation of the organic light emitting elements.

Since the structure and operation of the OLED display panel are well known, they will not be explained here.

The optical film 13 is disposed if necessary for suppressing the reflection of external light. It includes at least one polarizing layer and serves as a circular polarizer incorporating with a phase difference layer functioning as a quarter-wave plate. The polarizing layer transmits one component of a linearly polarized light among incident lights thereon while absorbing the other component orthogonal thereto. To produce the polarizing layer, a base film containing PVA (polyvinyl alcohol) stained or absorbed with dichroic materials such as iodine or organic dye is stretched and the dichroic materials are aligned thereon, revealing absorption dichroism. Then, two pieces of transparent protection films made of TAC (triacetyl cellulose) sandwich the base film from both sides. Examples of the phase difference layer include transparent polymer films, for example, cycloolefin polymer films or polycarbonate polymer films.

The optical film 130 has a larger area than the display area and fixed to the sealing means 120 with an adhesive layer (not shown) interposed therebetween, thereby fully covering the display area.

At this time, it is important to make the optical film 130 have the same external shape and size or slightly smaller compared to the sealing means 120 or the substrate having light emitting elements. In this way, the OLED display panel does not necessarily have a large external shape and size and the antireflection layer can be uniformly or evenly thick within the display area.

Even though it is desirable to make the optical films larger in area than the display area as much as possible because the layer thickness of the antireflection layer on the edge portions of the optical films is not likely to be uniform, the optical films are still required to have the same external shape and size or smaller than the sealing means or the substrate having light emitting elements not to increase the external shape and size of the OLED display panel unnecessarily.

The surface of the substrate 121 having light emitting elements has an area that is not covered by the sealing means 120 and connects an electric signal such as an image signal to the outside. In detail, a flexible printed circuit (hereinafter referred to simply as FPC) 15 is provided to this area of the substrate for the sake of the electric connection to the outside with this FPC 150 interposed therebetween. If necessary, a semiconductor chip 140 functioning as a driver may also be mounted in this area.

The OLED display panel 3 includes an antireflection layer 100 formed on at least the surface of the viewer side (outer surface) of the optical film 130 covering the display area, and layers made of the same material as the antireflection layer, each layer being formed on the inside surface of the substrate 121 and two side surfaces (edge faces on right and left sides) and the bottom surface (edge face at the bottom) of the OLED display panel 3 in FIG. 4, respectively.

In this case, since layers of the same material are deposited on the outer surface and the inside surface of the OLED display panel, even though the members constituting the display panel and the antireflection layer may have a different ratio of volume change by temperatures, they contract or expand equally on the outer and inside surfaces of the OLED display panel, thereby suppressing deformation, e.g., warping, of the display panel.

In addition, since the edge faces of the substrates constituting the OLED display panel are covered and protected by layers, minor cracks, leading to breakage, on the edge faces of thin glass substrates used for fabricating a thin OLED display panel do not appear.

By employing a layer with less than $10^{11}\Omega$ of surface resistance for the antireflection layer, the display area as well as end portions or edge faces of the OLED display panel are protected from adhesion of dust. An appropriate antireflection layer for the present invention will be explained in detail later.

Here, it is important that the OLED display panel has a structure that the connection of an electric signal to the outside is executed in a predetermined direction. That is, the FPC 150 connects to one side of the rectangular OLED display panel 3 when the display area is seen by the viewer in front of the display panel.

In such case, the FPC 150 is fixed to an area of the OLED display panel, namely, a portion of the substrate having light emitting elements not overlapped with the sealing means 12, directly or by interposing proper equipment. Also, by coating the antireflection layer by a dip coating method it becomes possible to deposit the layers made of the same material as the antireflection layer onto the outer surface, inside surface and three edge faces of the OLED display panel via a one-time process. In this manner, loss in coating materials is reduced and low-cost layers can be used.

2$^{nd}$ Embodiment of OLED Display Panel

Figure 7:
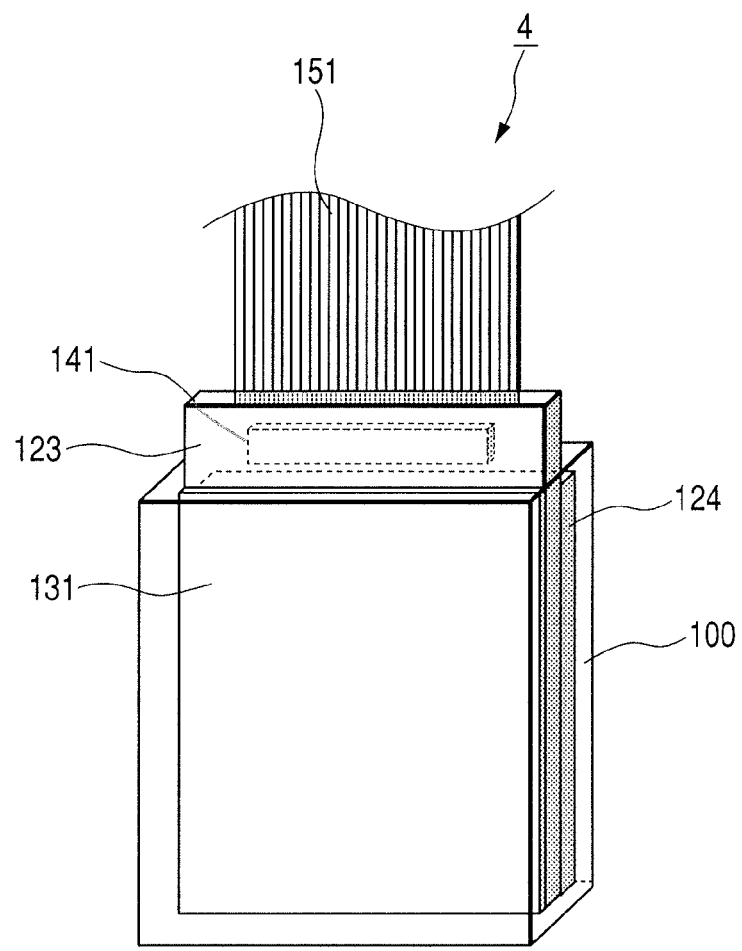
FIG. 7 is a schematic perspective view of an OLED display panel according to the present invention.

The following will now describe another embodiment of an OLED display panel according to the present invention with reference to accompanying drawings. FIG. 7 is a schematic perspective view of an OLED display panel in accordance with a second embodiment of the present invention, and FIGS. 8 and 9 respectively show cross sectional views of the OLED display panel of FIG. 7.

The OLED display panel 4 in this embodiment is a so-called bottom emission type OLED display panel out-coupling light from the substrate side having light emitting elements. The explanations of the same components as those of the OLED display panel according to the first embodiment of OLED display panel will be omitted hereafter.

The OLED display panel 4 includes a substrate 123 having organic light emitting elements forming a plurality of pixels arranged in a matrix, a sealing means 124, an optical film 131 deposited on the surface of the substrate 123 having light emitting elements, an antireflection layer formed on at least a portion of a display area on the side of a viewer (outer surface), and layers which are made from the same material as the antireflection layer and deposited on at least the opposite surface (inside surface) to the surface of the display area.

Figure 8:
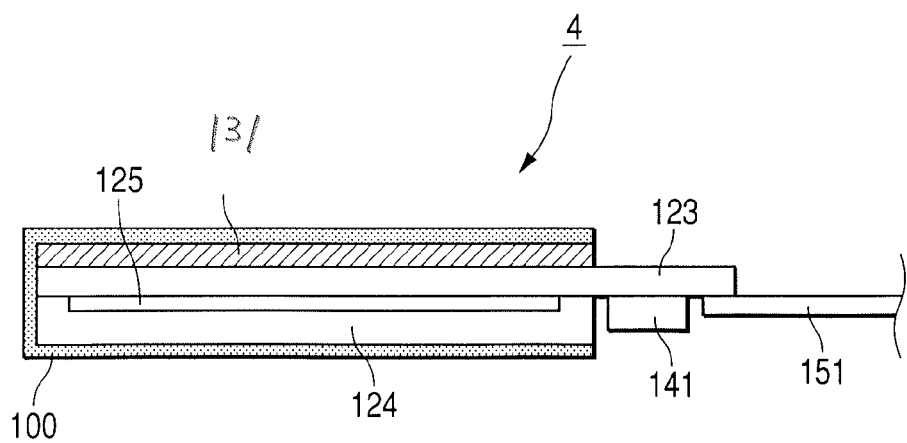
FIG. 8 is a schematic cross-sectional view of an OLED display panel according to the present invention.

In case of the bottom emission type, a transparent seal plate does not have to be used as the sealing means 124. Instead, as shown in FIG. 8, a metallic seal tube made of inexpensive stainless steel is used as the sealing means 124, which is air tightly sealed to the transparent substrate 123 by an adhesive seal member coated onto the periphery of the display area in a frame shape. In such case, a void 125 between the sealing means 124 and the transparent substrate 123 is filled with an inert gas, nitrogen for example, and a hygroscopic material (desiccant) (not shown) may be utilized, for a long lifetime of the organic light emitting diode.

Figure 9:
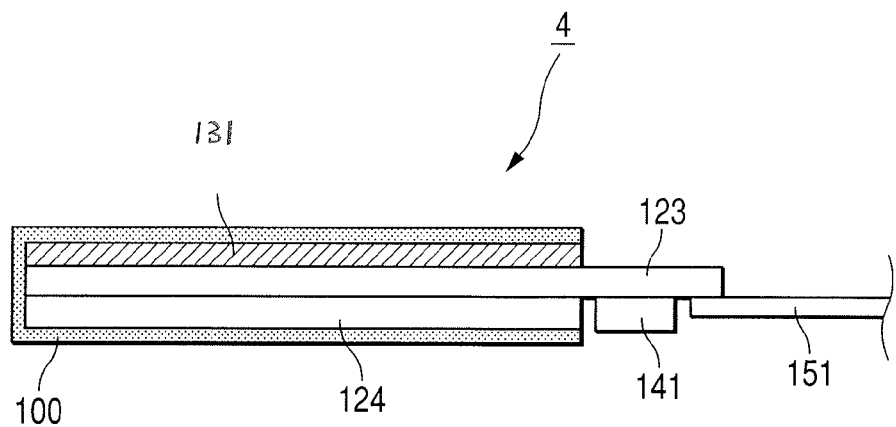
FIG. 9 is a schematic cross-sectional view of an OLED display panel according to the present invention.

Instead of using a sealing tube as the sealing means, as illustrated in FIG. 9, a laminate of inorganic transparent materials with the gas barrier property or a laminate of inorganic transparent materials and organic transparent materials with the gas barrier property being alternately layered repeatedly can be employed.

The optical film 131 is disposed if necessary for suppressing the reflection of external light. It includes at least one polarizing layer and serves as a circular polarizer incorporating with a phase difference layer functioning as a quarter-wave plate. The polarizing layer transmits one component of a linearly polarized light among incident lights thereon while absorbing the other component orthogonal thereto. To produce the polarizing layer, a base film containing PVA (polyvinyl alcohol) stained or absorbed with dichroic materials such as iodine or organic dye is stretched and the dichroic materials are aligned thereon, revealing absorption dichroism. Then, two pieces of transparent protection films made of TAC (triacetyl cellulose) sandwich the base film from both sides. Examples of the phase difference layer include transparent polymer films, for example, cycloolefin polymer films or polycarbonate polymer films.

The optical film 131 has a larger area than the display area and fixed to the transparent substrate 123 with an adhesive layer (not shown) interposed therebetween, thereby fully covering the display area.

The inside surface of the substrate 123 having light emitting elements has an area that is not covered by the sealing means 120 and connects an electric signal such as an image signal to the outside. In detail, a flexible print circuit board (hereinafter referred to simply as FPC) 151 is provided to this area of the substrate for the sake of the electric connection to the outside with this FPC 15 interposed therebetween. If necessary, a semiconductor chip 141 functioning as a driver may also be mounted in this area.

The OLED display panel 4 includes an antireflection layer 100 formed on at least the surface of the viewer side (outer surface) of the optical film 131 covering the display area, and layers made of the same material as the antireflection layer, each layer being formed on the surface of the sealing means 124 and two side surfaces (edge faces on right and left sides) and the bottom surface (edge face at the bottom) of the OLED display panel 3 in FIG. 7, respectively.

In this case, since layers of the same material are deposited on the outer surface and the inside surface of the OLED display panel, even though the members constituting the display panel and the antireflection layer may have a different ratio of volume change by temperatures, they contract or expand equally on the outer and inside surfaces of the OLED display panel, thereby suppressing deformation, e.g., warping, of the display panel.

In addition, since the edge faces of the substrates constituting the OLED display panel are covered and protected by layers, minor cracks, leading to breakage, on the edge faces of thin glass substrates used for fabricating a thin OLED display panel do not appear.

Moreover, by employing a layer with less than $10^{11}\Omega$ of surface resistance for the antireflection layer, the display area as well as end portions or edge faces of the OLED display panel are protected from the dust. An appropriate antireflection layer for the present invention will be explained in detail later.

Here, it is important that the OLED display panel has a structure that the connection of an electric signal to the outside is executed in a predetermined direction. That is, the FPC 151 connects to one side of the rectangular OLED display panel 4 when the display area is seen by the viewer in front of the display panel.

In such case, the FPC 151 is fixed to an area of the OLED display panel, namely, a portion of the transparent substrate 123 having light emitting elements not overlapped with the sealing means 124, directly or by interposing proper equipment. Also, by coating the antireflection layer by a dip coating method it becomes possible to deposit the layers made of the same material as the antireflection layer onto the outer surface, inside surface and three edge faces of the OLED display panel via a one-time process. In this manner, loss in coating materials is reduced and low-cost layers can be used.

2$^{nd}$ Embodiment of Liquid Crystal Display Panel

Figure 10:
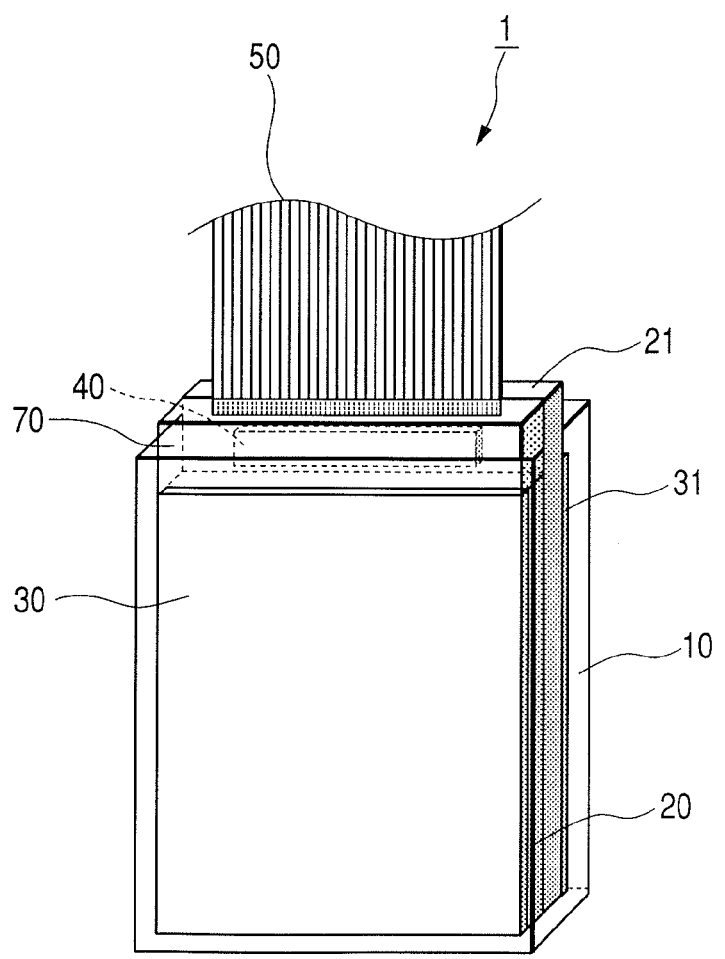
FIG. 10 is a schematic perspective view of a liquid crystal display panel according to the present invention.
Figure 11:
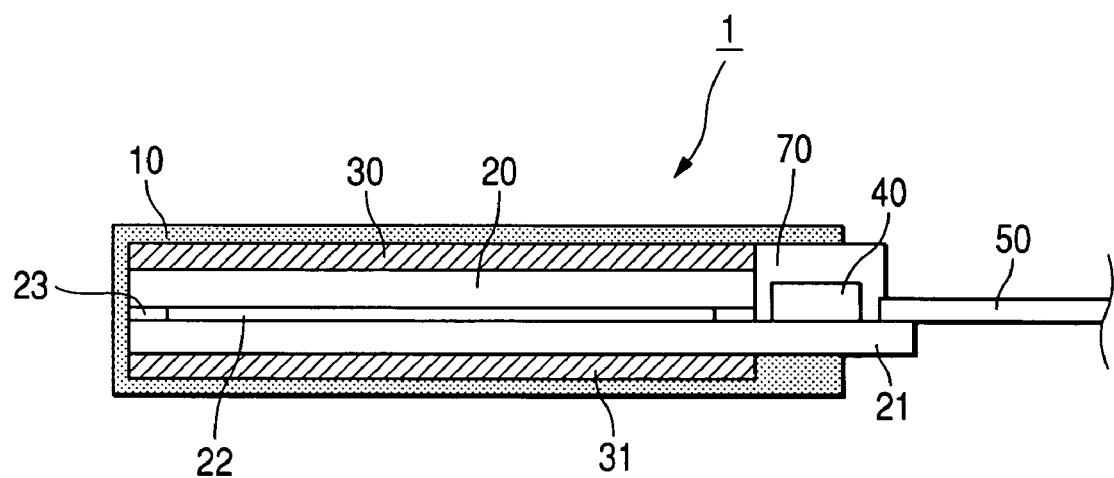
FIG. 11 is a schematic cross-sectional view of a liquid crystal display panel according to the present invention.
Figure 12:
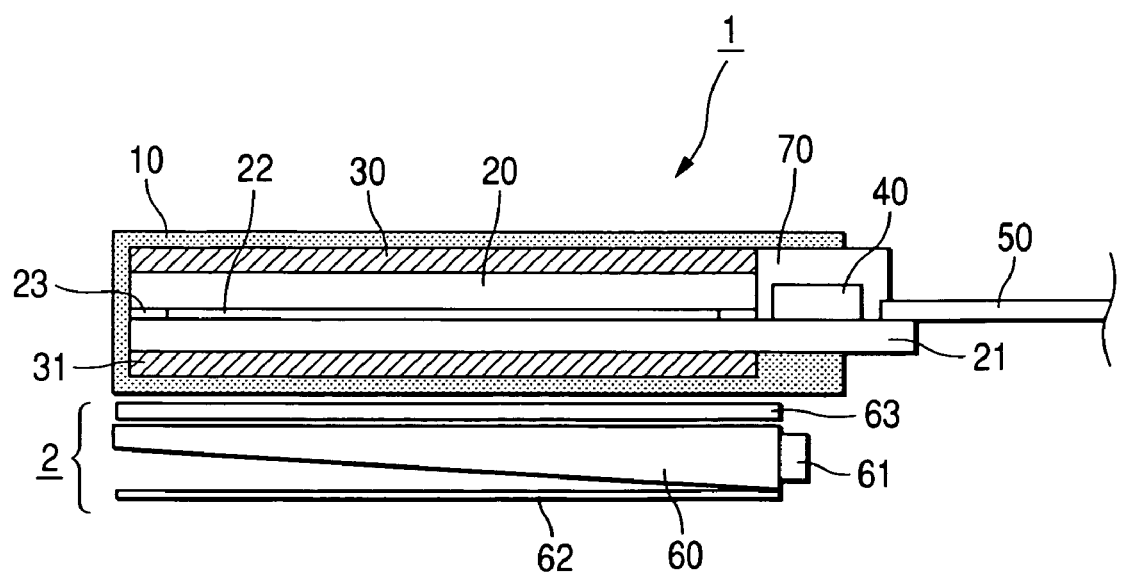
FIG. 12 is a schematic cross-sectional view of a liquid crystal display panel according to the present invention.

The following explains yet another embodiment of the liquid crystal display panel of the present invention. FIGS. 10 and 11 are a perspective view and a cross sectional view of the liquid crystal display panel, respectively, in accordance with the second embodiment of the present invention. Also, FIG. 12 is a schematic cross sectional view of a display device incorporating a liquid crystal display panel and a backlight device of the present invention.

With the components of the first embodiment of the liquid crystal display panel, the liquid crystal display panel in this embodiment includes a planarization layer 70 for planarizing the height on the other side of the first transparent substrate 20 not facing the second transparent substrate 21, which is formed on at least a portion of the surface of the second transparent substrate 21 facing the first transparent substrate 20 and not overlapped with the first transparent substrate 20. The liquid crystal display panel further includes an antireflection layer 10 formed on the display area which is at least a part of the planarization layer 70 and a visible side (outer surface) by a viewer; and layers made of the same material as the antireflection layer, each being formed on at least the opposite surface (inside surface) to the surface of the display area and on three edge faces. The same components as those of the liquid crystal display panel according to the first embodiment or like components are designated by the same reference numerals, and therefore the explanation of those components will be omitted hereafter.

In this embodiment, the planarization layer 70 of the liquid crystal display panel in this embodiment is newly formed on an area on the surface side of the second transparent substrate 21 not overlapped with the first transparent substrate 20, so as to reduce a stepped surface and increase the flat area on the liquid crystal display panel, that is, to make the display panel evenly flat. In effect, it is desirable to planarize the surface of the liquid crystal display panel in consideration of the thickness of the first optical film 30. Therefore, the planarization layer 70 should be formed not only on the second transparent substrate 21 but also on the first transparent substrate 20 or on the first optical film 30 so that much broader portions of the surface of the liquid crystal display panel can be planarized.

Both organic and inorganic materials can be used for the planarization layer 70, and it does not matter whether it is transparent or opaque in nature. However, in case that the planarization layer 70 needs to be deposited on the surface of the first optical film 30, it is better to be transparent to visible light. In addition, organic materials may be advantageously used for more easily removing the stepped surface. It is also necessary to take the resistance of the planarization layer 70 into consideration at the time of coating an antireflection layer thereon.

Here, when the antireflection layer is formed by a coating method, one should make sure that the surface on which the antireflection layer is to be deposited is not rugged because the resulting layer thickness would not be even due to the stepped surface. In consequence, the antireflection layer with homogeneous optical properties cannot be formed especially on the stepped surface and its peripheral portion.

On the contrary, the use of the planarization layer as in this embodiment lowers the prominences on the stepped surface of the liquid crystal display panel, thereby realizing the antireflection layer with excellent homogeneous optical properties at least on the display area.

In addition, in case of the liquid crystal display panel, by using the area where the planarization layer is formed also as the area used for connecting an electric signal to the outside, the antireflection layer with excellent homogeneous optical properties can be formed on the display area without particularly enlarging the frame size.

To be short, it is possible to realize a display panel which has the antireflection layer with excellent homogeneous optical properties on its display area and has a small frame.

Besides, the planarization layer deposited on the area for use in connection of an electric signal to the outside also serves to protect that particular area of the display panel. Especially when the antireflection layer is coated directly onto the display panel, the planarization layer serves to protect the electric connection portion as well.

3$^{rd}$ Embodiment of Liquid Crystal Display Panel

Figure 13:
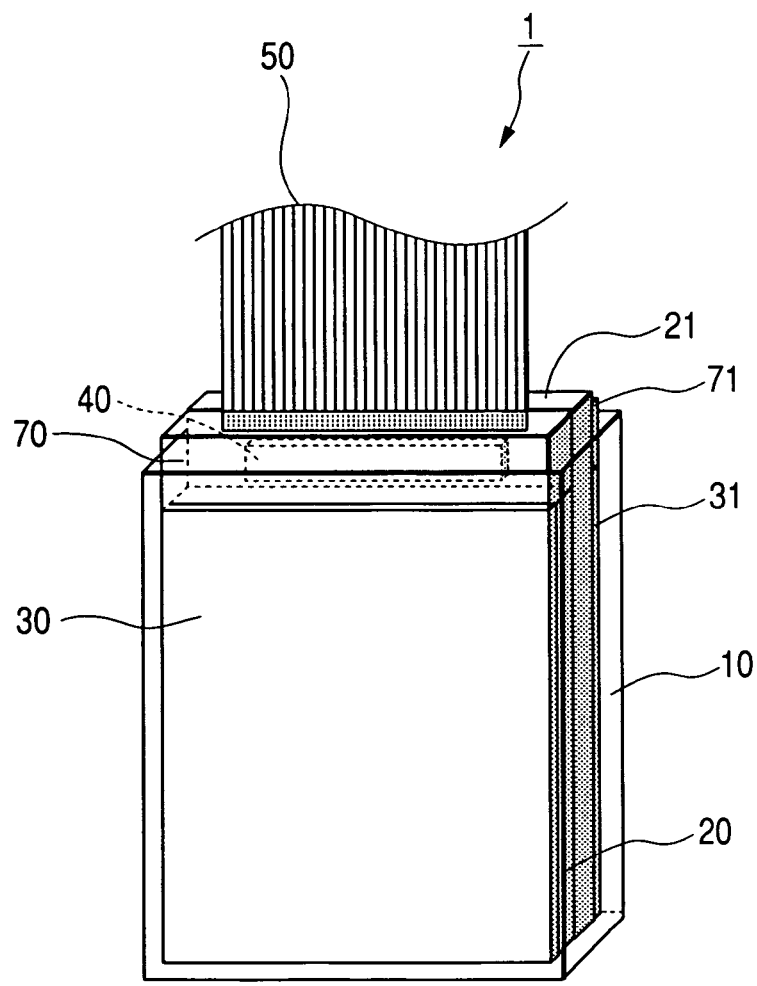
FIG. 13 is a schematic perspective view of a liquid crystal display panel according to the present invention.
Figure 14:
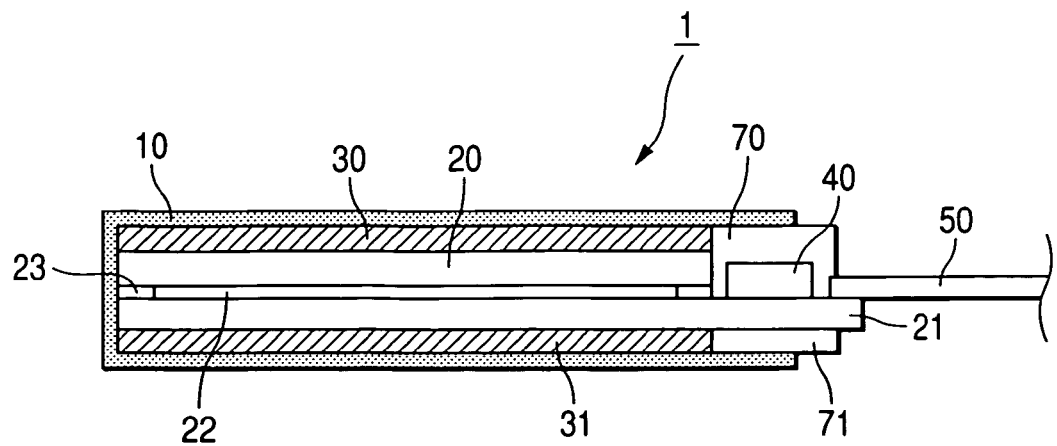
FIG. 14 is a schematic cross-sectional view of a liquid crystal display panel according to the present invention.
Figure 15:
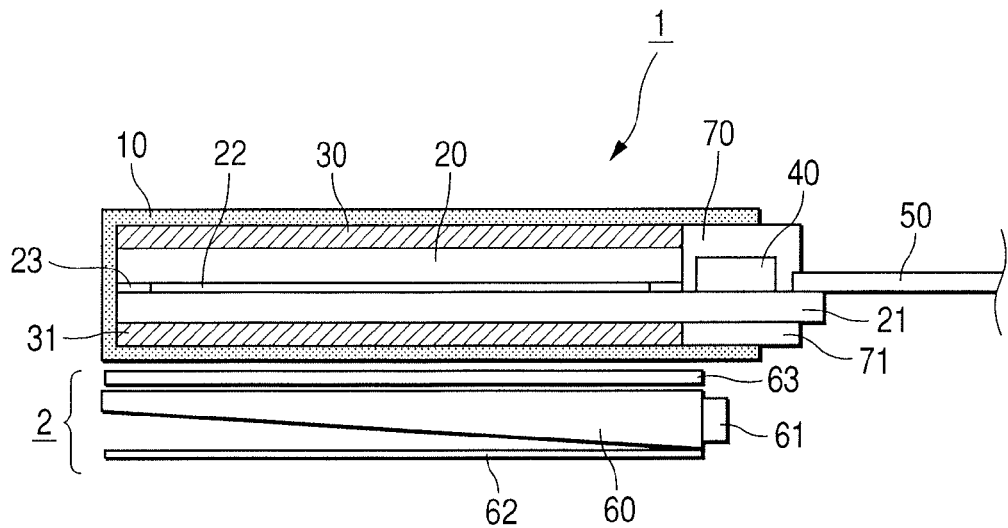
FIG. 15 is a schematic cross-sectional view of a liquid crystal display panel according to the present invention.

The following explains yet another embodiment of the liquid crystal display panel of the present invention. FIGS. 13 and 14 are a perspective view and a cross sectional view of the liquid crystal display panel, respectively, in accordance with the third embodiment of the present invention. Also, FIG. 15 is a schematic cross sectional view of a display device incorporating a liquid crystal display panel and a backlight device of the present invention.

With the components of the first embodiment of the liquid crystal display panel, the liquid crystal display panel in this embodiment includes a first planarization layer 70 for planarizing the height on the other side of a first optical film 30 not facing the first transparent substrate 20, in which the planarization layer 70 is formed on at least a portion of the surface of the second transparent substrate 21 facing the first transparent substrate 20 and not overlapped with the first transparent substrate 20. Also, the liquid crystal display panel in this embodiment includes a second planarization layer 71 for planarizing the height on the other side of a second optical film 31 not facing the second transparent substrate 21, in which the planarization layer 71 is formed on at least a portion of the surface of the second transparent substrate 21 not facing the first transparent substrate 20 and not overlapped with the first transparent substrate 20. Moreover, the liquid crystal display panel in this embodiment further includes an antireflection layer 10 formed on the display area which is at least a part of the first planarization layer 70 or the second planarization layer 71 and a visible side (outer surface) by a viewer; and layers made of the same material as the antireflection layer, each being formed on at least the opposite surface (inside surface) to the surface of the display area and on three edge faces. The same components as those of the liquid crystal display panel according to the first embodiment or like components are designated by the same reference numerals, and therefore the explanation of those components will be omitted hereafter.

The planarization layer 70 of the liquid crystal display panel in this embodiment is newly formed on an area on the surface side of the second transparent substrate 21 not overlapped with the first transparent substrate 20, so as to reduce a stepped surface and increase the flat area on the liquid crystal display panel, that is, to make the display panel evenly flat. In effect, it is desirable to planarize the surface of the liquid crystal display panel in consideration of the thickness of the first optical film 30. Therefore, the planarization layer 70 should be formed not only on the second transparent substrate but also on the first transparent substrate 20 or on the first optical film 30 so that much broader portions of the surface of the liquid crystal display panel can be planarized.

The planarization layer 71 of the liquid crystal display panel in this embodiment is newly formed on an area on the surface side of the second transparent substrate 21 not overlapped with the first transparent substrate 20, so as to reduce a stepped surface and increase the flat area on the liquid crystal display panel, that is, to make the display panel evenly flat. In effect, it is desirable to planarize the surface of the liquid crystal display panel in consideration of the thickness of the second optical film 31. Therefore, the planarization layer 71 should be formed not only on the second transparent substrate 21 but also on the second optical film 30 so that much broader portions of the surface of the liquid crystal display panel can be planarized.

Both organic and inorganic materials can be used for the planarization layers 70 and 71, and it does not matter whether they are transparent or opaque in nature. However, in case that the planarization layers 70 and 71 need to be deposited on the outer surface of the first optical film 30 or on the inside surface of the second optical film, it is better to be transparent to visible light. In addition, organic materials may be advantageously used for more easily removing the stepped surface. In such case, it is necessary to take the resistance of the planarization layer into consideration at the time of coating an antireflection layer thereon.

Here, when the antireflection layer is formed by coating, one should make sure that the surface on which the antireflection layer is to be deposited is not rugged because the resulting layer thickness would not be even due to the stepped surface. In consequence, the antireflection layer with homogeneous optical properties cannot be formed especially on the stepped surface and its peripheral portion.

On the contrary, the use of the planarization layer as in this embodiment lowers the prominences on the outer surface and the inside surface of the liquid crystal display panel, thereby realizing the antireflection layer with excellent homogeneous optical properties at least on the display area.

Moreover, the liquid crystal display panel of this embodiment has a structure in which an electrode forming a plurality of pixels arranged in a matrix is provided to the second transparent substrate, and there is an area for executing the connection of an electric signal such as an image signal to the outside, that is, in a predetermined direction. In this manner, the area where the planarization layer is formed for use also as the area used for connecting an electric signal to the outside, and therefore the antireflection layer with excellent homogeneous optical properties can be formed on the display area without enlarging the frame size additionally.

In other words, it is possible to realize a display panel which has the antireflection layer with excellent homogeneous optical properties on its display area and has a small frame.

3$^{rd}$ Embodiment of OLED Display Panel

Figure 16:
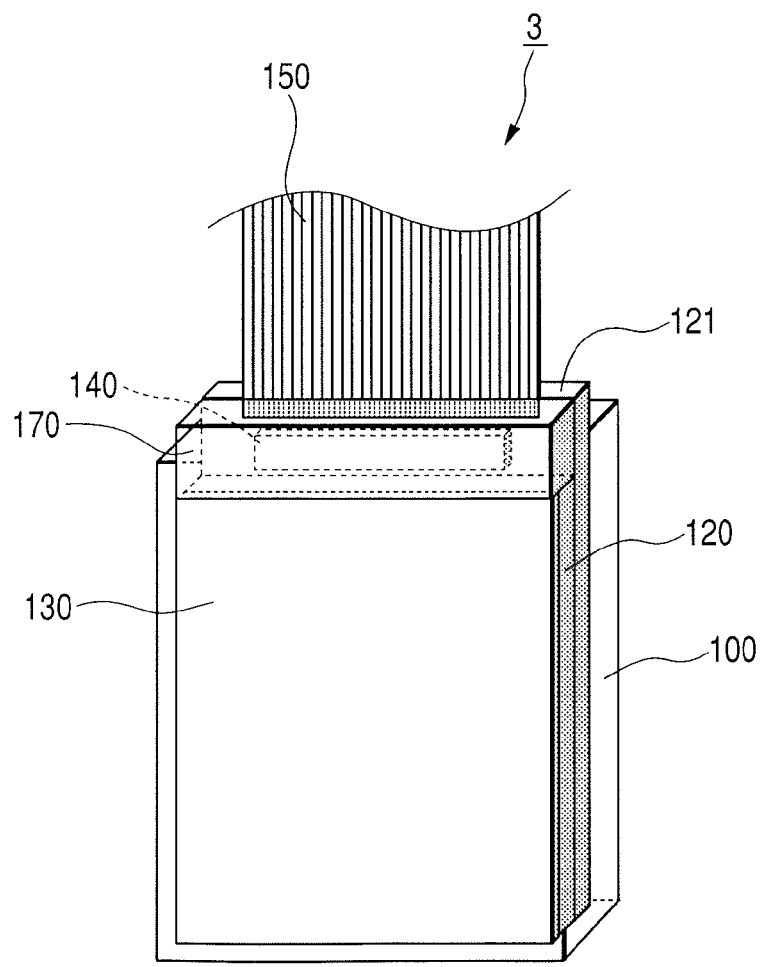
FIG. 16 is a schematic perspective view of an OLED display panel according to the present invention.
Figure 17:
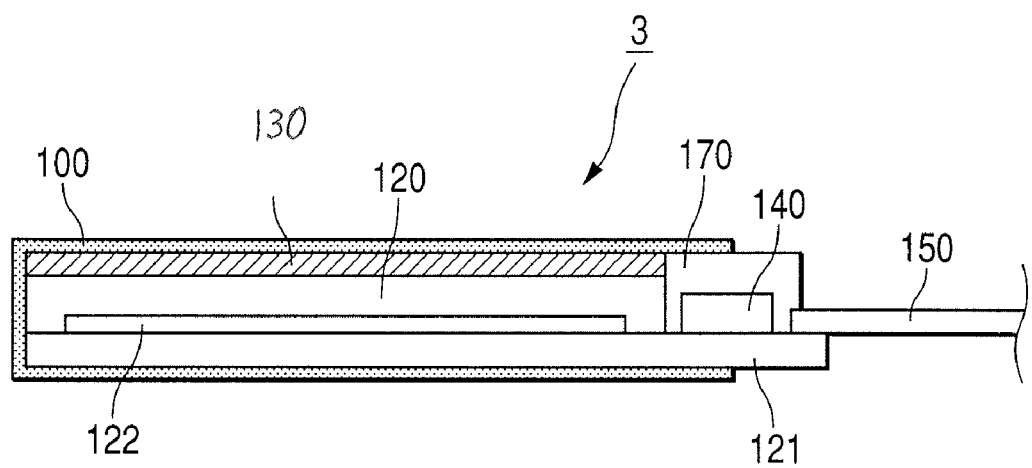
FIG. 17 is a schematic cross-sectional view of an OLED display panel according to the present invention.
Figure 18:
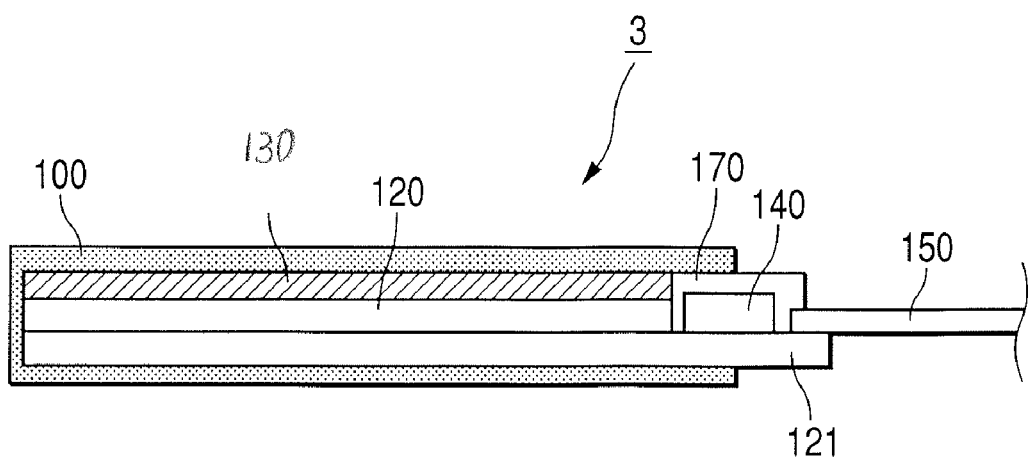
FIG. 18 is a schematic cross-sectional view of an OLED display panel according to the present invention.

The following will now describe yet another embodiment of an OLED display panel according to the present invention with reference to accompanying drawings. FIG. 16 is a schematic perspective view of an OLED display panel in accordance with a third embodiment of the present invention, and FIGS. 17 and 18 respectively show cross sectional views of the OLED display panel of FIG. 16.

With the components of the OLED display panel according to the first embodiment of the present invention, in the OLED display panel of this embodiment, the substrate 121 having light emitting elements is larger in area than the sealing means 120 and a display area exists in an overlapped area between the substrate 121 having light emitting elements and the sealing means 120. Moreover, the OLED display panel of this embodiment includes a planarization layer 170 for planarizing the height on the other side of the sealing means 120 not facing the substrate 121 having light emitting elements, in which the planarization layer is formed on at least a portion of the surface of the substrate 121 having light emitting elements facing the sealing means 120 and not overlapped with the sealing means 120. The OLED display panel of this embodiment further includes an antireflection layer 100 formed at a display area thereof which is at least a part of the planarization layer 170 and a visible side of a viewer (outer surface) and layers made of the same material as the antireflection layer formed on at least the opposite side of the surface of the display area and on three edge faces.

The same components as those of the first embodiment or like components are designated by the same reference numerals, and therefore the explanation of those components will be omitted hereafter.

The planarization layer 170 of the OLED display panel in this embodiment is newly formed on an area on the surface side of the substrate 121 with light emitting elements not overlapped with the sealing means 120, so as to reduce a stepped surface and increase the flat area on the liquid crystal display panel, that is, to make the display panel evenly flat. In effect, it is desirable to planarize the surface of the liquid crystal display panel in consideration of the thickness of the optical film 130. Therefore, the planarization layer 170 should be formed not only on the substrate 121 with light emitting elements but also on the sealing means 120 or on the optical film 130 so that much broader portions of the surface of the liquid crystal display panel can be planarized.

Both organic and inorganic materials can be used for the planarization layer 170, and it does not matter whether it is transparent or opaque in nature. However, in case that the planarization layer 170 needs to be deposited on the surface of the optical film 130, it is better to be transparent to visible light. In addition, organic materials may be advantageously used for more easily removing the stepped surface. In such case, it is necessary to take the resistance property of the planarization layer 170 into consideration at the time of coating an antireflection layer thereon.

Here, when the antireflection layer is formed by coating, one should make sure that the surface on which the antireflection layer is to be deposited is not rugged because the resulting layer thickness would not be even due to the stepped surface. In consequence, the antireflection layer with homogeneous optical properties cannot be formed especially on the stepped surface and its peripheral portion. On the contrary, the use of the planarization layer as in this embodiment lowers the prominences on the stepped surface of the OLED display panel, thereby realizing the antireflection layer with excellent homogeneous optical properties at least on the display area.

In addition, the OLED display panel of this embodiment has a structure wherein an area exists for executing the connection of an electric signal such as an image signal to the outside, that is, in a predetermined direction. In this manner, the area where the planarization layer is formed to be used also as the area used for connecting an electric signal to the outside, and therefore the antireflection layer with excellent homogeneous optical properties can be formed on the display area without enlarging the frame size additionally.

In other words, it is possible to realize a display panel which has the antireflection layer with excellent homogeneous optical properties formed on its display area and has a small frame.

Besides, the planarization layer deposited on the area for use in connection of an electric signal to the outside also serves to protect that particular area of the display panel. Especially when the antireflection layer is coated directly onto the display panel, the planarization layer serves to protect the electric connection portion as well.

4th Embodiment of OLED Display Panel

Figure 19:
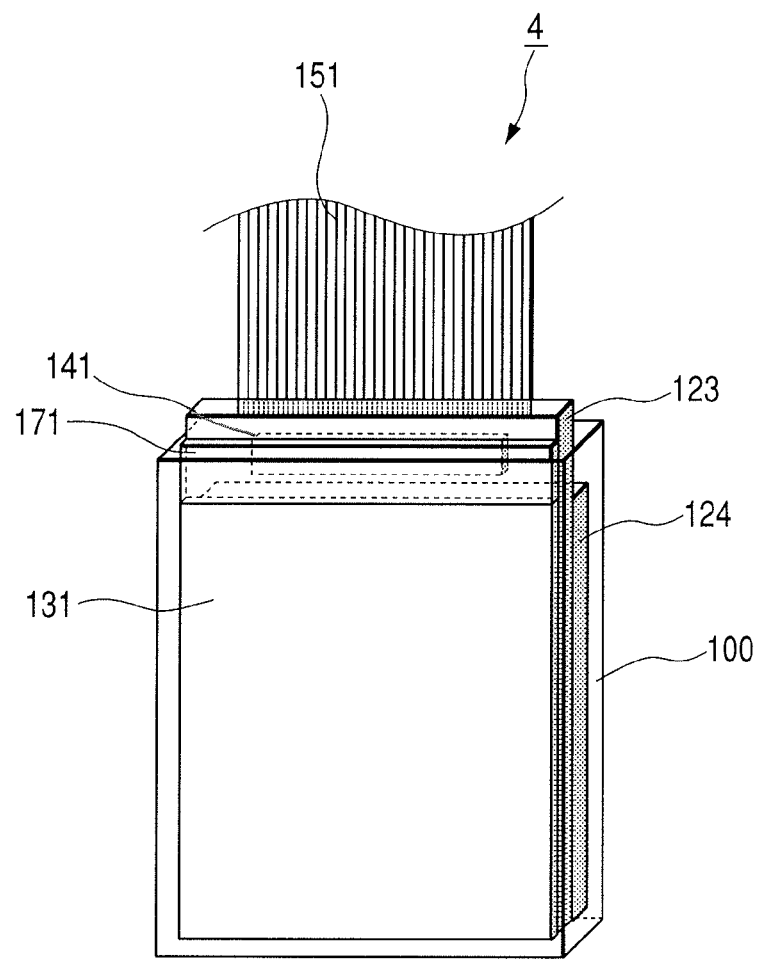
FIG. 19 is a schematic perspective view of an OLED display panel according to the present invention.
Figure 20:
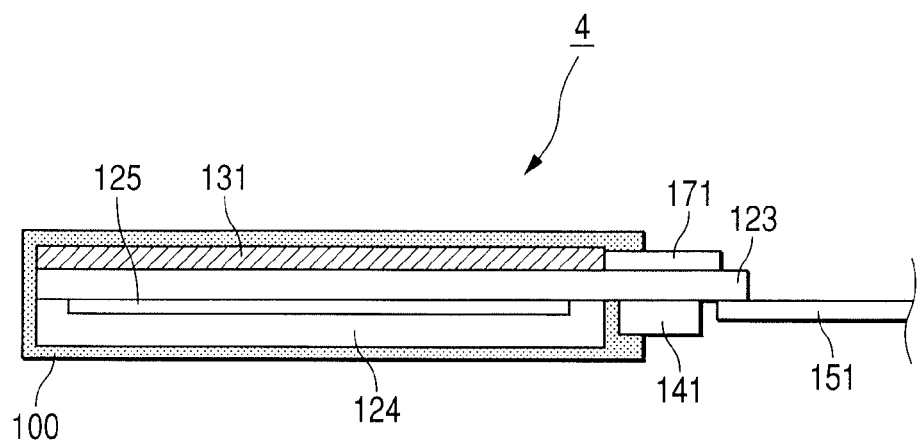
FIG. 20 is a schematic cross-sectional view of an OLED display panel according to the present invention.
Figure 21:
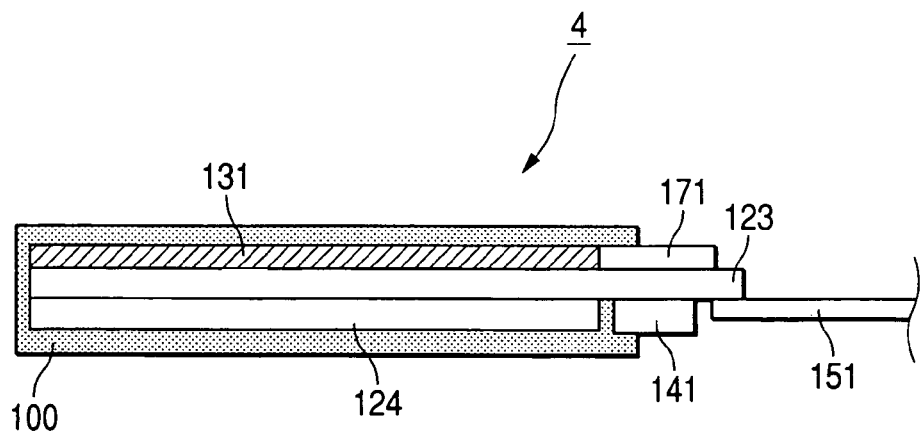
FIG. 21 is a schematic cross-sectional view of an OLED display panel according to the present invention.

The following will now describe yet another embodiment of an OLED display panel according to the present invention with reference to accompanying drawings. FIG. 19 is a schematic perspective view of an OLED display panel in accordance with a fourth embodiment of the present invention, and FIGS. 20 and 21 respectively show cross sectional views of the OLED display panel of FIG. 19.

With the components of the OLED display panel according to the second embodiment of the present invention, in the OLED display panel of this embodiment, an image light is out-coupled from the side of a transparent substrate 123 with light emitting elements. In addition, the OLED display panel of this embodiment includes an optical film 131 having at least one polarizing layer formed on the other side of the transparent substrate 123 not facing the sealing means 124; and a planarization layer 171 for planarizing the height on the other side of the optical film 131 not facing the transparent substrate 123, in which the planarization layer 171 is formed on at least a portion of the surface of the transparent substrate 123 not facing the sealing means 124 and not overlapped with the optical film 131. The OLED display panel of this embodiment further includes an antireflection layer 100 formed at a display area thereof which is at least a part of the planarization layer 171 and a visible side of a viewer (outer surface), and layers made of the same material as the antireflection layer formed on at least the opposite side of the surface of the display area (inside surface) and on three edge faces.

The same components as those of the first embodiment or like components are designated by the same reference numerals, and therefore the explanation of those components will be omitted hereafter. The planarization layer 171 of the OLED display panel in this embodiment is newly formed on an area on the surface side of the substrate 123 with light emitting elements not overlapped with the optical film 131, so as to reduce a stepped surface and increase the flat area on the liquid crystal display panel, that is, to make the display panel evenly flat. Therefore, the planarization layer 171 may be formed not only on the substrate 123 with light emitting elements but also on the optical film 131 so that much broader portions of the surface of the liquid crystal display panel can be planarized.

Both organic and inorganic materials can be used for the planarization layer 171, and it does not matter whether it is transparent or opaque in nature. However, in case that the planarization layer 171 needs to be deposited on the surface of the optical film 131, it is better to be transparent to visible light. In addition, organic materials may be advantageously used for more easily removing the stepped surface. In such case, it is necessary to take the resistance property of the planarization layer 171 into consideration at the time of coating an antireflection layer thereon.

Here, when the antireflection layer is formed by a coating method, one should make sure that the surface on which the antireflection layer is to be deposited is not rugged because the resulting layer thickness would not be even due to the stepped surface. In consequence, the antireflection layer with homogeneous optical properties cannot be formed especially on the stepped surface and its peripheral portion. On the contrary, the use of the planarization layer as in this embodiment lowers the prominences on the stepped surface of the OLED display panel, thereby realizing the antireflection layer with excellent homogeneous optical properties at least on the display area.

In addition, the OLED display panel of this embodiment has a structure wherein an area exists in the substrate with light emitting elements for executing the connection of an electric signal such as an image signal to the outside, that is, in a predetermined direction. In this manner, the area where the planarization layer is formed for use also as the area used for connecting an electric signal to the outside, and therefore the antireflection layer with excellent homogeneous optical properties can be formed on the display area without enlarging the frame size additionally. In other words, it is possible to realize a display panel which has the antireflection layer with excellent homogeneous optical properties on its display area and has a small frame.

4th Embodiment of Liquid Crystal Display Panel

Figure 22:
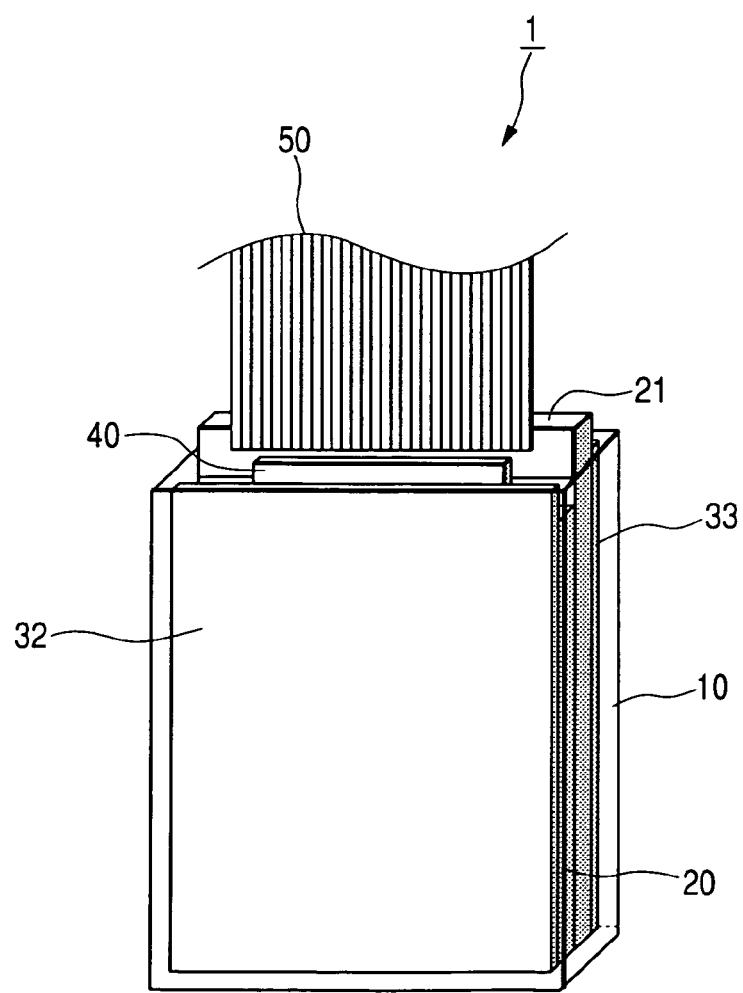
FIG. 22 is a schematic perspective view of a liquid crystal display panel according to the present invention.
Figure 23:
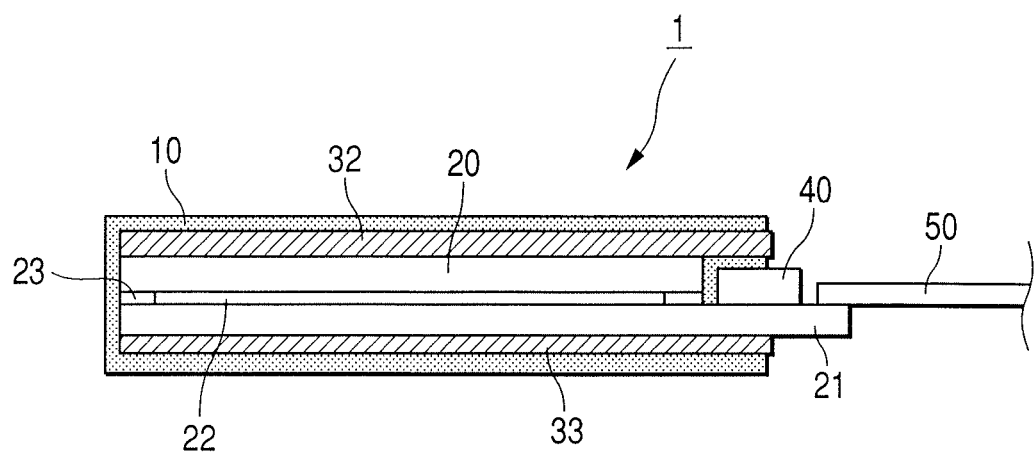
FIG. 23 is a schematic cross-sectional view of a liquid crystal display panel according to the present invention.
Figure 24:
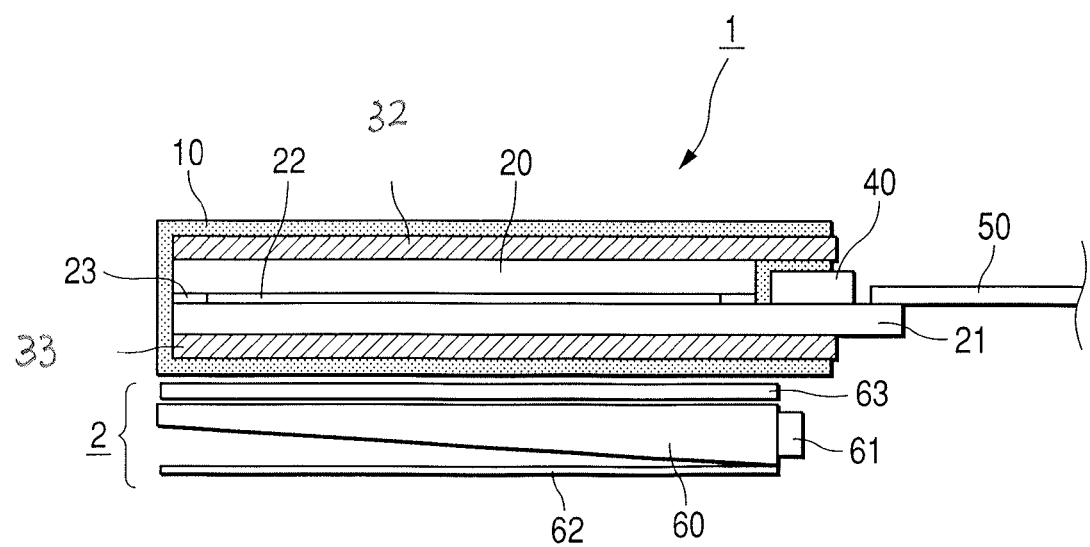
FIG. 24 is a schematic cross-sectional view of a liquid crystal display panel according to the present invention.

The following explains yet another embodiment of the liquid crystal display panel of the present invention. FIGS. 22 and 23 are a perspective view and a cross sectional view of the liquid crystal display panel, respectively, in accordance with the fourth embodiment of the present invention. Also, FIG. 24 is a schematic cross sectional view of a display device incorporating a liquid crystal display panel and a backlight device of the present invention.

With the components of the liquid crystal display panel according to the first embodiment, in the liquid crystal display panel of this embodiment, the second transparent substrate 21 is larger in area than the first transparent substrate 20 and a display area exists in an overlapped area between the first transparent substrate 20 and the second transparent substrate 21. In addition, the first optical film 32 and the second optical film 33 are larger in area than the first transparent substrate 20, covering at least a portion of the area of the second transparent substrate 21 not overlapped with the first transparent substrate. Moreover, the liquid crystal display panel of this embodiment includes an antireflection layer formed on the display area which is at least a part of the first optical film or the second optical film and a visible side (outer surface) by a viewer; and layers made of the same material as the antireflection layer, each being formed on at least the opposite surface (inside surface) to the surface of the display area and on three edge faces.

The same components as those of the liquid crystal display panel according to the first embodiment or like components are designated by the same reference numerals, and therefore the explanation of those components will be omitted hereafter.

In the liquid crystal display panel of this embodiment, the antireflection layer is deposited on the enlarged optical film. That is, it is possible to form the antireflection layer on an area that is not affected by the stepped surface of the liquid crystal display panel and is broader than the display area. Therefore, the antireflection layer with homogeneous optical properties can be realized at least in the display area. In other words, it is possible to realize a display panel which has the antireflection layer with excellent homogeneous optical properties on its display area and has a small frame.

Moreover, according to the liquid crystal display panel of this embodiment, the enlarged area of an optical film area and the area for use in connecting an electric signal to the outside can be overlapped with each other. Thus, the antireflection layer with excellent homogeneous optical properties can be realized in its display area without necessarily enlarging the frame size of the display panel.

Further, it is desirable to make the area of the first optical film and the second optical film larger in area than the first transparent substrate yet not larger in area than the second transparent substrate. The reason for making the area of the first optical film and the second optical film larger in area than the first transparent substrate is to be able to form the antireflection layer on an area that is not affected by the stepped surface of the liquid crystal display panel and is broader than the display area. Moreover, the reason for making the area of the first optical film and the second optical film smaller than the second transparent substrate is not to increase the external shape and size of the liquid crystal display panel unnecessarily.

Hence, according to a desired external shape and size of the optical film, a length in the orthogonal direction (side) to the direction where the liquid crystal display panel connects an electric signal to the outside almost coincides with the first transparent substrate, and a length in the orthogonal direction thereof is not longer than the second transparent substrate and not shorter than the first transparent substrate.

In case of the liquid crystal display panel of this embodiment, in order to prevent the enlarged first optical film 32 from being distorted by contacting a structure, e.g., a driver such as a semiconductor chip 40, disposed on the second transparent substrate 22, it is made thinner than the first transparent substrate or formed on a place the optical film does not come in contact with, on the FPC for example.

5th Embodiment of OLED Display Panel

Figure 25:
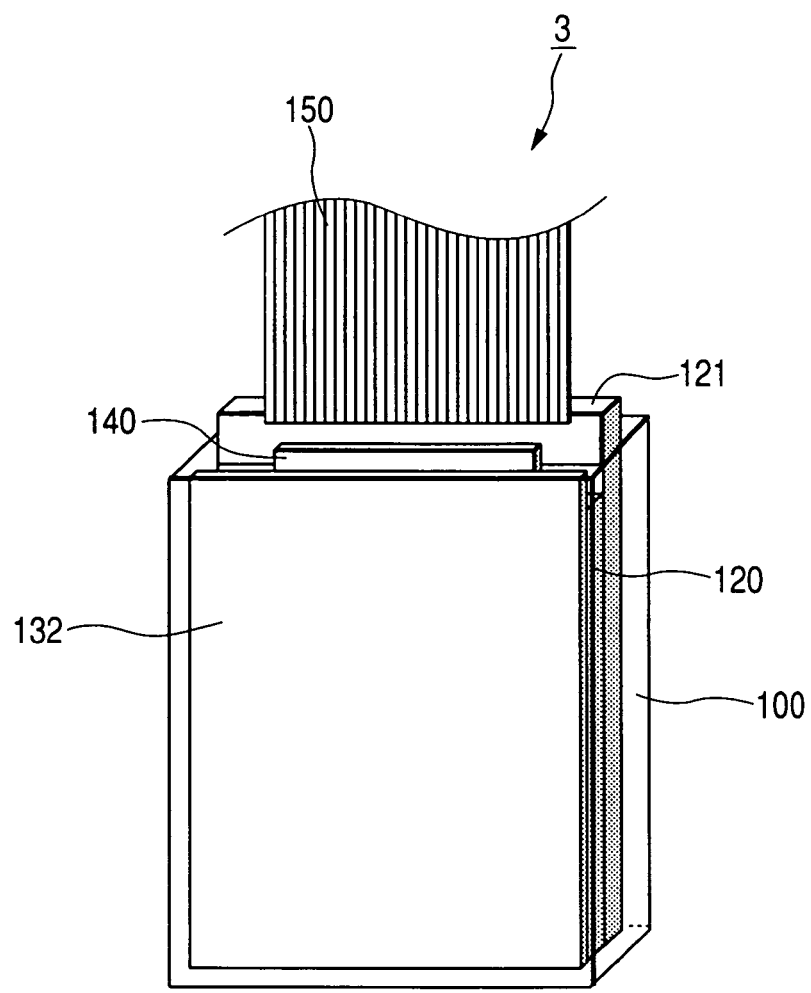
FIG. 25 is a schematic perspective view of an OLED display panel according to the present invention.
Figure 26:
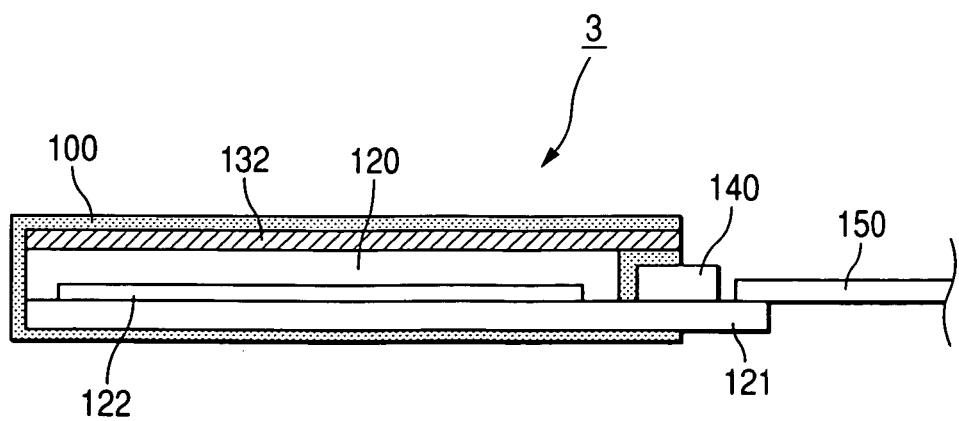
FIG. 26 is a schematic cross-sectional view of an OLED display panel according to the present invention.
Figure 27:
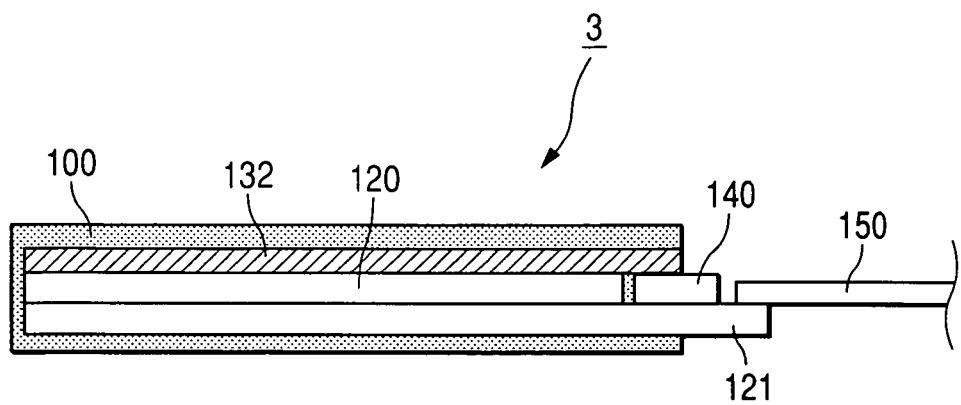
FIG. 27 is a schematic cross-sectional view of an OLED display panel according to the present invention.

The following explains yet another embodiment of the OLED display panel of the present invention. FIG. 25 is a schematic perspective view of the OLED display panel according to a fifth embodiment of the present invention, and FIGS. 26 and 27 are schematic views showing cross sectional structure of the OLED display panel of FIG. 25, respectively.

With the components of the OLED display panel according to the first embodiment, in the OLED display panel of this embodiment, the substrate 121 with light emitting elements is larger in area than the sealing means 120 and a display area exists in an overlapped area between the substrate 121 and the sealing means 120. In addition, the optical film 132 is larger in area than the sealing means 120, covering at least a portion of the area of the substrate 121 with light emitting elements not overlapped with the sealing means 120.

Moreover, the OLED display panel of this embodiment includes an antireflection layer 100 formed on the display area which is at least a part of the optical film 132, the overlapped area on the substrate 121 with light emitting elements not overlapped with the sealing means 120, and a visible side (outer surface) by a viewer; and layers made of the same material as the antireflection layer, each being formed on at least the opposite surface (inside surface) to the surface of the display area and on three edge faces.

The same components as those of the liquid crystal display panel according to the first embodiment or like components are designated by the same reference numerals, and therefore the explanation of those components will be omitted hereafter.

In the OLED display panel of this embodiment, the antireflection layer is deposited on the optical film enlarged in area. That is, it is possible to form the antireflection layer on an area that is not affected by the stepped surface of the liquid crystal display panel and is broader than the display area. Therefore, the antireflection layer with homogeneous optical properties can be realized at least in the display area.

In addition, the OLED display panel of this embodiment has a structure wherein an area exists in the substrate with light emitting elements for executing the connection of an electric signal such as an image signal to the outside, that is, in a predetermined direction. Because the area of an enlarged optical film area and the area for use in connecting an electric signal to the outside can be overlapped with each other, the antireflection layer with excellent homogeneous optical properties can be realized in its display area without necessarily enlarging the frame size of the display panel. In other words, it is possible to realize a display panel which has the antireflection layer with excellent homogeneous optical properties on its display area and has a small frame.

Further, it is desirable to make the area of the optical film larger in area than the sealing means and smaller than the substrate with light emitting elements. The reason for making the area of the optical film larger in area than the sealing means is to be able to form the antireflection layer on an area that is not affected by the stepped surface of the liquid crystal display panel which is broader than the display area. Moreover, the reason for making the area of the optical film smaller than the substrate with light emitting elements is not to increase the external shape and size of the liquid crystal display panel unnecessarily.

Hence, according to a desired external shape and size of the optical film, a length in the orthogonal direction (side) to the direction where the display panel connects an electric signal to the outside almost coincides with the substrate having light emitting elements, and a length in the orthogonal direction thereof is not longer than the substrate having light emitting elements and not shorter than the sealing means.

6th Embodiment of OLED Display Panel

Figure 28:
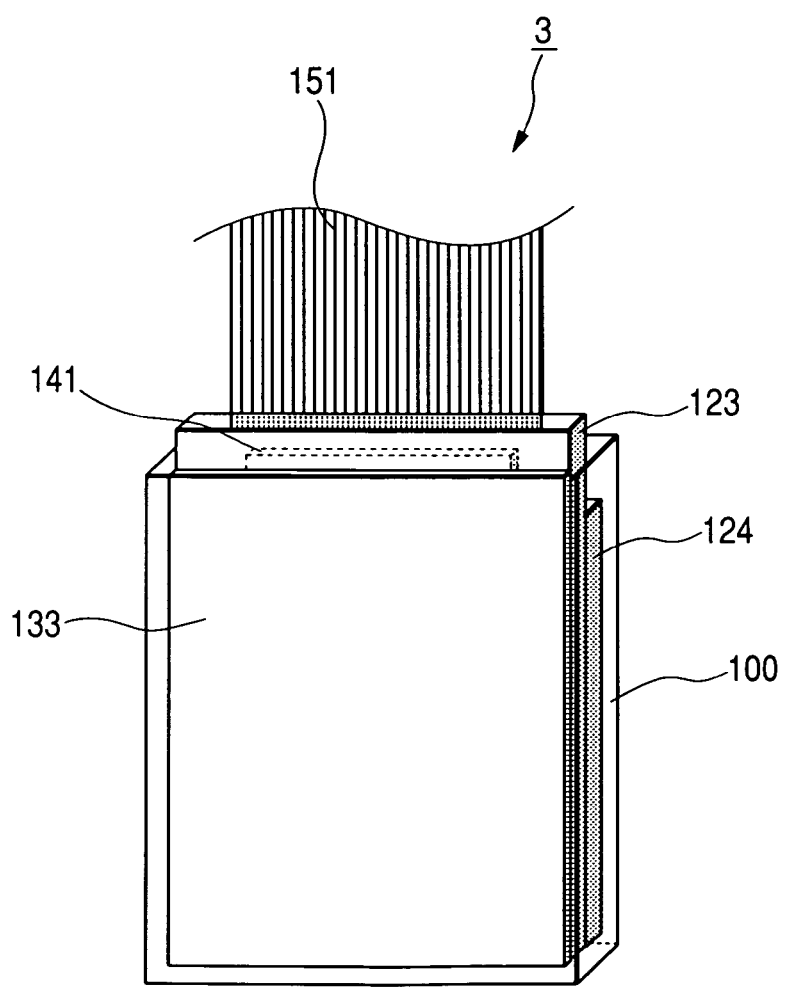
FIG. 28 is a schematic perspective view of an OLED display panel according to the present invention.
Figure 29:
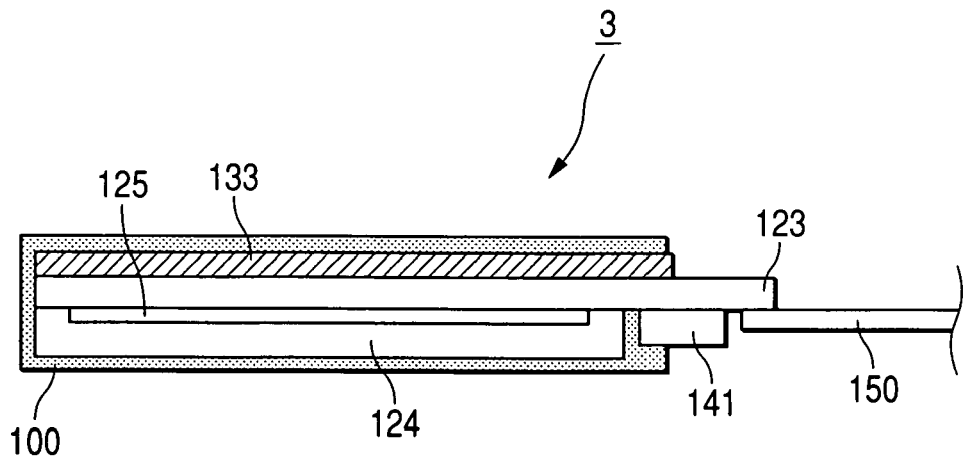
FIG. 29 is a schematic cross-sectional view of an OLED display panel according to the present invention.
Figure 30:
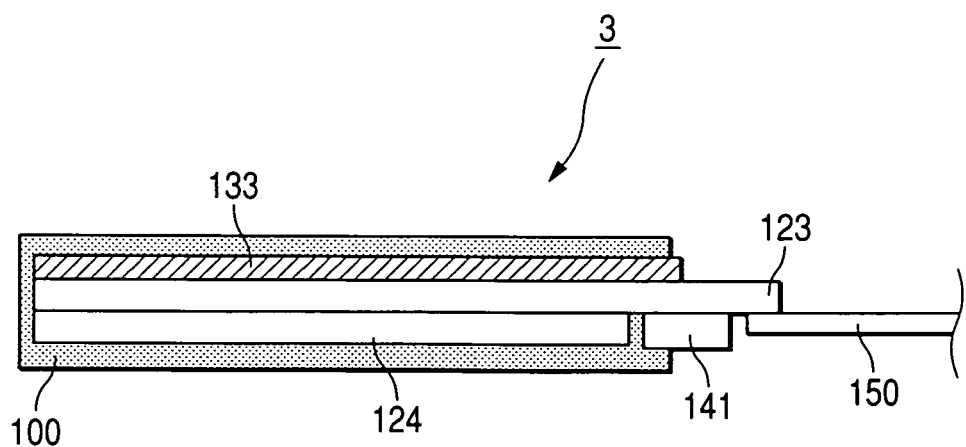
FIG. 30 is a schematic cross-sectional view of an OLED display panel according to the present invention.

The following explains yet another embodiment of the OLED display panel of the present invention. FIG. 28 is a schematic perspective view of the OLED display panel according to a sixth embodiment of the present invention, and FIGS. 29 and 30 are schematic views showing cross sectional structure of the OLED display panel of FIG. 28, respectively.

With the components of the OLED display panel according to the second embodiment, in the OLED display panel of this embodiment, the transparent substrate 123 with light emitting elements is larger in area than the sealing means 124 and a display area exists in an overlapped area between the transparent substrate 123 with light emitting elements and the sealing means 124. In addition, the optical film 133 is larger in area than the sealing means 124, covering at least a portion of the area of the transparent substrate 123 with light emitting elements not overlapped with the sealing means 124.

Moreover, the OLED display panel of this embodiment includes an antireflection layer 100 formed on the display area which is at least a part of the optical film 133, the overlapped area on the transparent substrate 123 with light emitting elements not overlapped with the sealing means 124, and a visible side (outer surface) by a viewer; and layers made of the same material as the antireflection layer, each being formed on at least the opposite surface (inside surface) to the surface of the display area and on three edge faces.

The same components as those of the liquid crystal display panel according to the second embodiment or like components are designated by the same reference numerals, and therefore the explanation of those components will be omitted hereafter.

In the OLED display panel of this embodiment, the antireflection layer is deposited on the enlarged optical film. That is, it is possible to form the antireflection layer on an area that is not affected by the stepped surface of the liquid crystal display panel and is broader than the display area. Therefore, the antireflection layer with homogeneous optical properties can be realized at least in the display area.

In addition, the OLED display panel of this embodiment has a structure wherein an area exists in the substrate with light emitting elements for executing the connection of an electric signal such as an image signal to the outside, that is, in a predetermined direction. Because the area of an enlarged optical film area and the area for use in connecting an electric signal to the outside can be overlapped with each other, the antireflection layer with excellent homogeneous optical properties can be realized in its display area without necessarily enlarging the frame size of the display panel. In other words, it is possible to realize a display panel which has the antireflection layer with excellent homogeneous optical properties on its display area and has a small frame.

Further, it is desirable to make the area of the optical film equal to or smaller than the substrate having light emitting elements. The larger the area of the optical film, the easier it is to form the antireflection layer with excellent homogeneous properties within the display area. Also, the reason for making the area of the optical film not larger in area than the substrate having light emitting elements is not to increase the external shape and size of the liquid crystal display panel unnecessarily.

Hence, according to a desired external shape and size of the optical film, a length in the orthogonal direction (side) to the direction where the display panel connects an electric signal to the outside almost coincides with the substrate having light emitting elements, and a length in the orthogonal direction thereof is not longer than the substrate having light emitting elements and not shorter than the sealing means.

Embodiment of Antireflection Layer

The following now describes a preferred embodiment of the antireflection layer according to the present invention. Preferably, the antireflection layer of the present invention is composed of fine inorganic oxide particles and a binder. The binder at this time functions as a binder for the antireflection layer. Basically, this layer is prepared by inorganic oxide particles and a mixed coating of a binder and a solvent, coated onto a substrate and heated. In case that the binder is a thermosetting substance, for example, silica sol, an epoxy resin monomer, an melamine resin monomer and the like, an extremely small amount of a catalyst may be added to the coating in order to promote polymerization, or thermosetting of the coating layer. Moreover, the antireflection layer of this embodiment can be formed by a single-layer process as well as a multi-layer process. However, for the sake of reducing costs, the single-layer process is more desired.

Figure 33:
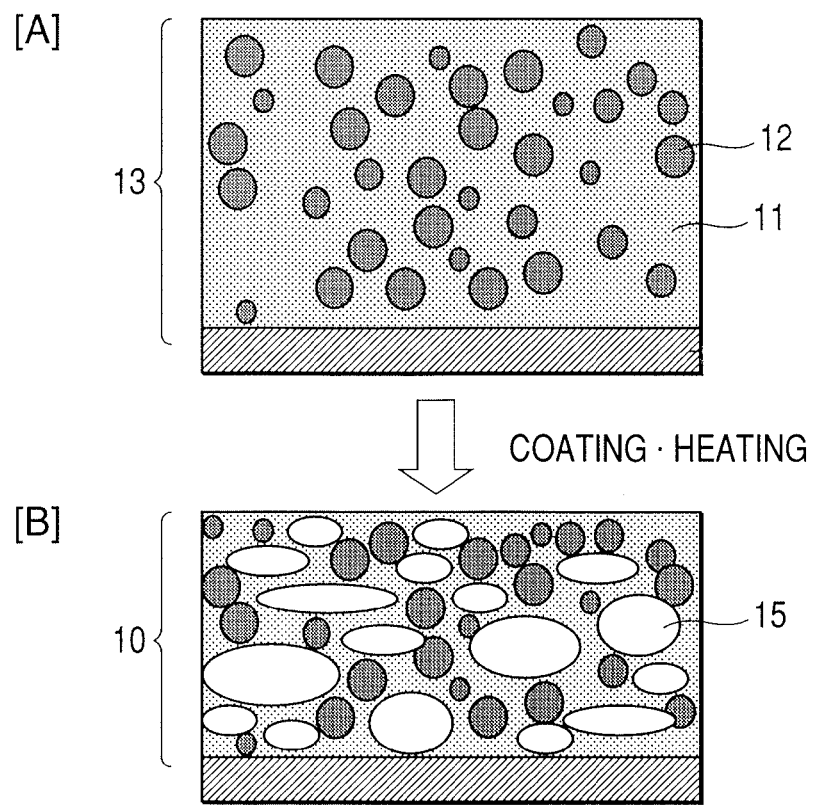
FIG. 33 is an explanatory diagram describing the forming method of an antireflection layer according to the present invention.

With reference to FIG. 33, a preparation method of the antireflection layer is described as follows.

First, an antireflection coating 13 composed of a mixture 11 of a binder and a solvent and fine inorganic oxide particles 12 is evenly coated onto a display panel (Process A).

When solidifying the coating layer by heating, the solvent is vaporized and an antireflection layer 10 (or 100) having a void 15 theresinside is formed (Process B).

Figure 34:
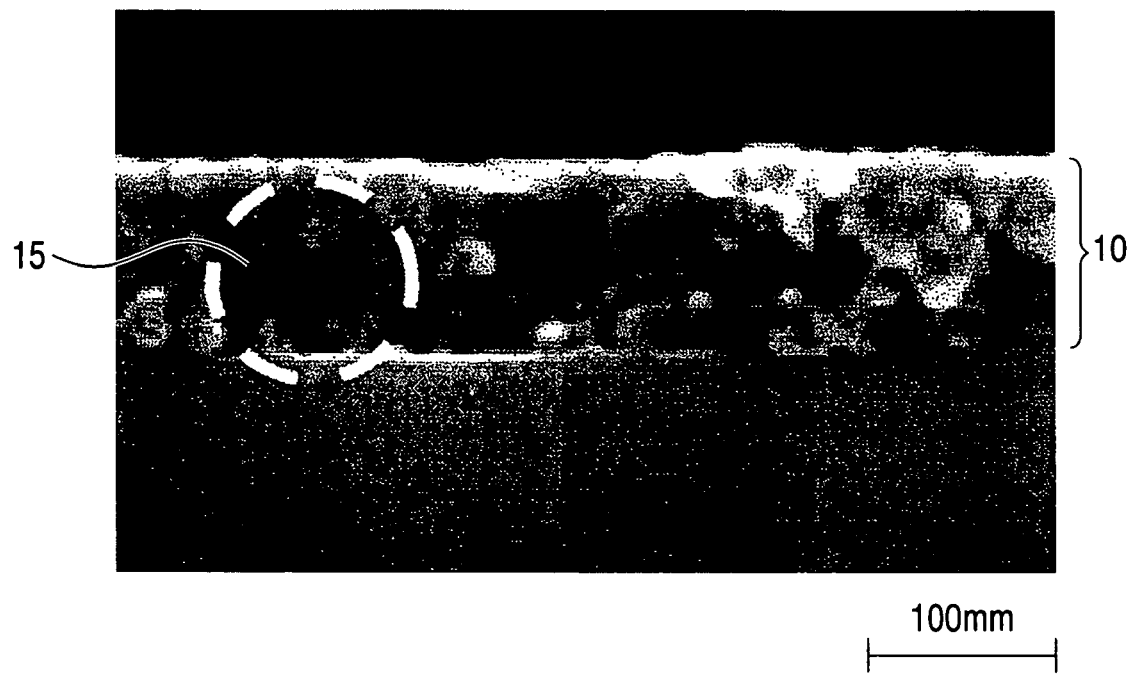
FIG. 34 is a photograph of an antireflection layer showing a cross section according to the present invention.

FIG. 34 is an SEM (scanning electron microscopy) photograph illustrating the cross section of an antireflection layer according to one embodiment of the present invention, in which the antireflection layer shown in FIG. 33(B) is deposited on a substrate (a very thin platinum layer is deposited on the surface of the layer of FIG. 34).

Particles contained in the layer are silicon oxide which is an inorganic oxide, which are bound to each other by a binder of silica sol. The SEM photograph of FIG. 34 shows a bright portion and a dark portion in the layer. When measured by energy-dispersion X-ray analysis (EDX), it turned out that a great amount of silicon oxide particles exist in the bright portion while only a small amount of the same exist in the dark portion. Therefore, one can conclude that the portion with small silicon oxide particles is a void 15 which is formed as the solvent is vaporized while heating the antireflection coating.

The refractive index of the main constituent of the layer, silicon oxide, is approximately 1.5 while the refractive index of the void is approximately 1.0. Thus, by properly adjusting the ratio of the void to the total area of the layer, a desired refractive index can be achieved.

In addition, because the vaporization of the solvent during the thermosetting process contributes to the formation of a void, it is possible to suppress the formation of a void by controlling the boiling point of the solvent used and the thermosetting temperature after the coating is coated onto the substrate. Referring back to FIG. 34, one can see in the cross sectional view taken by the SEM that the voids mainly exist inside the layer, but only a few voids are formed on the surface of the layer. In effect, if too many voids are formed on the surface of the layer, the layer surface becomes rugged and irregular to a great extent, being easily caught by a cloth during wiping. However, if the layer surface is smooth and not much rugged, it is not easily caught by the cloth, and therefore, the layer is less prone to peeling and scratches. In other words, physical strength of the layer is improved.

The following now explains in detail a coating solution for the antireflection layer and coating.

(1) Coating Solution

The coating solution is composed of a binder, fine inorganic oxide particles and a solvent. Each of these constituent is described below.

(1-1) Binder

A binder for coating solutions may be selected from highly transparent, organic or inorganic high-molecular-weight materials, and materials polymerizable to have a high molecular weight.

Organic high-molecular-weight materials include thermoplastic ones. More specifically, they include acryl resin, polystyrene, styrene/acryl copolymer, polyester resin, polyvinyl chloride, ethylene/vinyl acetate copolymer, polyethylene terephthalate resin (PET), polyvinylidene chloride (PVDC)

and polycarbonate resin. Organic materials polymerizable to have a high molecular weight include thermo setting ones. More specifically, they include a polyamic acid derivative having an aliphatic structure.

Examples of the inorganic high-molecular-weight materials include a silicon compound having a hydrolysable residue (commonly referred to as silica sol) and titanium compound having a hydrolysable residue (commonly referred to as titania sol). These are compounds of alkoxy silane or alkoxy titanium polymerized to have a molecular weight of several thousands, and are soluble in alcohol-based solvents. When heated, they can be formed into a binder of silicon oxide or titanium oxide.

Inorganic materials polymerizable to have a high molecular weight include alkoxy silane having a varying substituent, e.g., amino, chloro or mercapto group. They are specifically cited later, when silicon compounds having a hydrolysable residue are described.

Silica sol can be cited as one of silicon compounds having a hydrolysable residue. It is transformed into silicon oxide, when heated. One of the typical methods for forming silica sol is described. A tetraalkoxy silane is polymerized to have a molecular weight of several thousands on the average, when heated in a weakly acidic condition, because alkoxy group is hydrolyzed into hydroxyl group, which reacts with neighboring alkoxy group to form the silicon-oxygen-silicon bond.

Tetraalkoxy silanes for producing silica sol are selected form the group consisting of: tetramethoxy silane, tetraethoxy silane, tetrapropoxy silane, tetraisopropxy silane, tetrabutoxy silane and tetraisobutoxy silane. Silicon compounds having chlorine group instead of alkoxy silane group, e.g., silicon tetrachloride, are also suitable.

Silicon compounds having a hydrolysable residue other than tetraalkoxy silanes include those having amino, chloro or mercapto group. More specifically, they are selected from the group consisting of: 3-aminopropyltrimethoxy silane, 3-aminopropyltriethoxy silane, N-(2-aminoethyl)-3-aminopropyltrimethoxy silane, 3-chloropropyltrimethoxy silane, 3-chloropropylmethyldimethoxy silane, 3-mercaptopropyltrimethoxy silane, vinyl trimethoxy silane, vinyl triethoxy silane, 3-glycidoxygropyltrimethoxy silane, 3-glycidoxypropylmethyldimethoxy silane and 3-methacryloxypropyltrimethoxy silane.

(1-2) Fine Inorganic Oxide Particles

The fine inorganic oxide particles for the present invention are colorless fine particles of silicon, aluminum, titanium and cerium oxides.

(1-2-1) Size/Shape of Fine Inorganic Oxide Particle

When the fine inorganic oxide particles are spherical, they preferably have a particle size below ½ of the wavelength to prevent scattering of incident light. Since visible light has a wavelength of 380 nm-780 nm, the light does not scatter in that range. Thus, an average particle size is preferably 190 nm or less. For behavior of particles in visible light, see "Industrial Science of Color," Yoshinobu Naya, $2^{nd}$ edition, published by Asakura Shoten, Feb. 10, 1984, page 2. The particles larger in area than 190 nm may not be suitable for displays, because of possible scattering of incident light to make the coating cloudy. Even when the particles have a ring (chain) shape, they have preferably a diameter of the short axis not greater than 190 nm for the same reason as the above. Moreover, two or more types of fine inorganic oxide particles of different size of shape may be used.

(1-2-2) Other Suggestions for Selecting Inorganic Oxide Particles

It should be noted that the silicon compound may agglomerate the primary particles into the larger secondary particles, when insufficiently soluble in the solvent, to also cause the problems of making the coating cloudy. It is therefore preferable to use a solvent capable of well dispersing the fine silicon oxide particles. Such a solvent, however, cannot be used depending on a plate to be used. In such a case, a dispersant is used to well disperse them.

Colloidal silica is suitable for the fine silicon oxide particles. The colloidal silica products include organosilica sol, e.g., Snowtex (Nissan Chemical Industries). These fine particles have hydroxyl group massively on the surface, and are highly hydrophilic. Moreover, an antireflection layer containing these particles is hydrophilic and, at the same time, has a very low electrical resistance of around $1 \times 10^{10}$ to $10 \times 10^{10} \Omega$. This level is much lower than that of glass ($10^{12}$ to $10^{16} \Omega$), acryl resin (around $10^{16} \Omega$), polycarbonate (around $10^{16} \Omega$), or PET resin (around $10^{16} \Omega$) of the order of $1/10,000$ to $1/1,000,000$. Therefore, the coating efficiently prevents deposition of dust or the like thereon, making itself applicable to widely varying devices. An image-forming device having the coating of the invention formed on the surface of a substrate can display dust-free, clean images for extended periods, even when placed in a dry indoor area. For the same reason, the antireflection layer of the present invention is suitable for a coating used in a display device installed in homes, offices, etc.

Moreover, the antireflection layer of the present invention can have liquid repellency, when treated with a perfluoropolyether compound having alkoxy silane group or water repelling agent of perfluoroalkyl compound, described later.

In addition to silicon oxide, aluminum oxide is also a useful material for its low refractive index. For example, alumina sol having hydroxyl group massively on the surface is suitably used to form a coating of low resistivity.

(1-3) Solvent

An effective solvent for the coating solution dissolves or evenly disperses the binder therein. An alcohol-based solvent is suitable for the coating solution comprising a silicon compound having a hydrolysable residue as the suitable binder and fine silicon oxide particles suitable as the fine inorganic oxide particles. More specifically, the alcohol-based solvents useful for the present invention are selected from the group consisting of: ethanol, n-propanol, iso-propanol, n-butanol, iso-butanol, tert-butanol, n-pentanol, iso-pentanol and tert-pentanol.

(2) Layer-Fabrication Method

The antireflection layer of the present invention is fabricated by pre-treating a plate, coating and heating. It may be formed by a process for forming a single-layer or multi-layer film, but the former is preferred for the sake of reducing manufacturing cost. Moreover, the heating step may be followed by post-treatment to improve wear-resistance of the layer. These steps are described below in detail.

(2-1) Pre-Treatment

In the pre-treatment step, it is desired to improve fouling resistance of the surface of a display panel by cleansing for example. This is to evenly deposit a coating solution on the plate. Typically, a polarizer is disposed on the surface of a display panel and a protection film forming the polarizer is oxidized, so it can be used as it is.

(2-2) Coating Method

The methods for coating the plate include, but are not limited to, spin coating, dip coating, bar coating, coating by an applicator, spray coating and flow coating. However, dip coating (pickling) is suitable considering that the coating should be formed directly on the display panel, or five surfaces of the display panel.

In order to control the coating at an adequate thickness, it is necessary to optimize a correct coating solution concentration and conditions. For instance, in case of dip coating, the conditions which affect coating thickness are dipping time and withdrawing speed.

Figure 35:
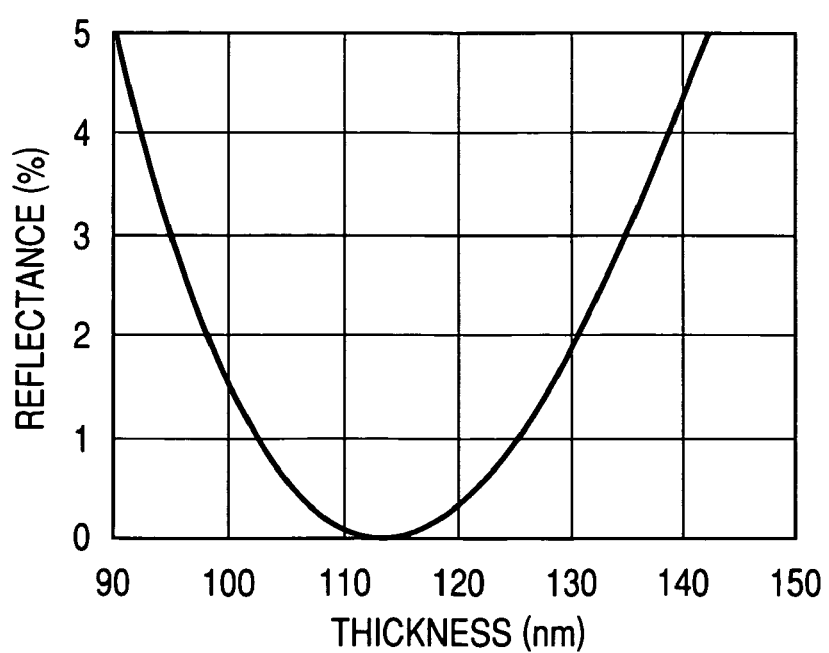
FIG. 35 is a drawing showing a relation between layer thickness and reflectance of an antireflection layer of the present invention.

Refractive index (n) of a layer thickness (d) for attaining a minimum reflectance to incident light with a wavelength λ can be expressed as d=λ/(4n). The layer thickness (d) of the antireflection layer is carefully set to attain a minimum reflectance at a wavelength offering the highest luminosity to humans among 380-780 nm wavelengths for visible light. Luminosity factor varies among individuals. A wavelength (λ) at which relative spectral responsivity attains a maximum in the photopic relative luminosity curve ("Industrial Science of Color," yoshinobu Naya, $2^{nd}$ edition, published by Asakura Shoten, Feb. 10, 1984, pages 4 to 8) is around 555 nm. In other words, a wavelength at which humans' luminosity factor attains a maximum is around 555 nm in a bright environment. Refractive index of an antireflection layer theoretically decreasing reflectance to 0% depends on refractive index of a plate on which the layer is formed, and it is the square root of that of the plate. A transparent resin film such as a polarizing protection film is disposed on the outermost surface of a display panel and its refractive index ranges approximately from 1.49 to 1.54. Thus, the antireflection layer preferably has a refractive index of 1.22 to 1.24. As described so far, an antireflection layer thickness which theoretically decreases reflection of a light with a wavelength of 555 nm from a plate with a refractive index of 1.5 to 0% is 116 nm. An uncoated plate without an antireflection layer has a reflectance of around 4% on one side, and an antireflection layer thickness which can decrease reflectance to 4% or less is in a range from 90 to 140 nm. FIG. 35 illustrates the relationship between reflectance and layer thickness under the above conditions.

(2-3) Heating

The coated plate is heated to remove the solvent by vaporization, or to accelerate the polymerization depending on a binder used.

However, a heating temperature besides the boiling point of the solvent needs to be set at a heat resisting temperature of a display panel or lower. In addition, when a thermosetting resin is used as the binder, the heating should be carried out at a thermosetting temperature of the resin or higher. It is therefore necessary to select the solvent and binder materials to satisfy these requirements. Also, if the layer and the display panel show different volume contraction rates when cooled following the heating process, the layer may easily be peeled or the display panel can be deformed. To prevent these problems, the display panel is preferably made of a material similar to that for the layer or a material having coefficient of linear expansion close to that of the layer. In addition, a layer having the same thickness is formed on the front surface and the rear surface of the display panel, respectively, to prevent the display panel from warping caused by the difference in coefficient of linear expansion of the layer and the display panel.

(2-4) Outline of Post Treatment

The antireflection layer of the present invention is produced when it is thermally set. Its surface will have improved fouling resistance, when coated with a fluorine compound having liquid repellency. However, the layer of a fluorine compound having liquid repellency should be sufficiently thin not to deteriorate the antireflection capacity of the layer. Thickness of the liquid-repellent layer is less than 6 nm to control the adverse effect on layer reflectance at less than 1% at a light wavelength of 555 nm at which spectral luminous efficiency is kept at a high level.

The coating layer of a fluorine compound having liquid repellency may be formed by one of the following two methods.

Coating with a Layer of Fluorine Compound Having Liquid Repellency

This method coats the antireflection layer with a layer of fluorine compound having liquid repellency. The coating exhibits liquid repellency. It should be noted that in the case the antireflection layer has low resistance, a liquid-repellent fluorine compound is covered, which increases surface resistance, possibly accelerating deposition of dust or the like thereon.

The material useful for forming the liquid-repellent layer includes CYTOP (Asahi Glass) and INT304VC (INT Screen). Each of these materials is diluted with a solvent, spread on a plate and heated to remove the solvent by vaporization, in order to form the liquid-repellent layer. Depending on circumstances, it may be thermally set during the heating step.

Binding a Perfluoropolyether Compound or Perfluoroalkyl Compound

This method binds a perfluoropolyether or perfluoroalkyl compound having an alkoxy silane group or the like, at the terminal, which can be bound to the antireflection layer. More specifically, the compounds represented by Formula 1 can be bound to the antireflection layer.

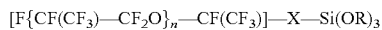

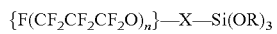

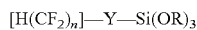

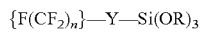  Formula 1 wherein, X is a site at which a perfluoropolyether chain and alkoxy silane residue are bound to each other, Y is a site at which a perfluoroalkyl chain and alkoxy silane residue are bound to each other, and R is an alkyl group.

The compound does not fully cover the surface of the antireflection layer, but perfluoropolyether chain or perfluoroalkyl chain grow on the antireflection layer like grass growing on the ground. Therefore, since the surface of the antireflection layer is not completely covered, the layer of low resistance ($10^{11}\Omega$ or less) can be maintained even when coated with the above compound.

Moreover, forming a perfluoropolyether or perfluoroalkyl chain on the layer surface has improved lubricity. Hence, it becomes possible to relax wear-caused physical damages on the surface and to form the surface high wear resistance.

(2-5) Liquid-Repellent Agent for Post-Treatment

As described in (2-4), the liquid-repellent agents useful for the present invention include perfluoropolyether and perfluoroalkyl compounds having an alkoxy silane group at the terminal. The liquid-repellent agents and liquid-repellant films can be produced as follows.

(a) Liquid-Repellent Agents

Liquid-repellent agents are perfluoropolyether and perfluoroalkyl compounds having an alkoxy silane group at the terminal, and can be expressed by the following compounds 1 to 12:

Formula 2

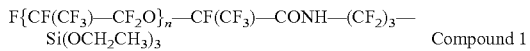  Compound 1

Formula 3

F{CF(CF$_3$)—CF$_2$O}$_n$—CF(CF$_3$)—CONH—(CH$_2$)$_3$—Si(OCH$_3$)$_3$   Compound 2

Formula 4

F{CF$_2$CF$_2$CF$_2$O}$_n$—CF$_2$CF$_2$—CONH—(CH$_2$)$_3$—Si(OCH$_2$CH$_3$)$_3$   Compound 3

Formula 5

F{CF$_2$CF$_2$CF$_2$O}$_n$—CF$_2$CF$_2$—CONH—(CH$_2$)$_3$—Si(OCH$_3$)$_3$   Compound 4

Formula 6

H(CF$_2$)$_6$—CONH—(CH$_2$)$_3$—Si(OCH$_2$CH$_3$)$_3$   Compound 5

Formula 7

H(CF$_2$)$_6$—CONH—(CH$_2$)$_3$—Si(OCH$_3$)$_3$   Compound 6

Formula 8

H(CF$_2$)$_8$—CONH—(CH$_2$)$_3$—Si(OCH$_2$CH$_3$)$_3$   Compound 7

Formula 9

H(CF$_2$)$_8$—CONH—(CH$_2$)$_3$—Si(OCH$_3$)$_3$   Compound 8

Formula 10

F(CF$_2$)$_6$—(CH$_2$)$_2$—Si(OCH$_3$)$_3$   Compound 9

Formula 11

F(CF$_2$)$_8$—(CH$_2$)$_2$—Si(OCH$_3$)$_3$   Compound 10

Formula 12

F(CF$_2$)$_6$—(CH$_2$)$_2$—Si(OCH$_2$CH$_3$)$_3$   Compound 11

Formula 13

F(CF$_2$)$_8$—(CH$_2$)$_2$—Si(OCH$_2$CH$_3$)$_3$   Compound 12

Of these, compounds 1 to 8 can be fabricated by the methods described below. Compounds 9 to 12 are supplied by Hydrus Chemical as 1H, 1H, 2H, 2H-perfluorooctyltrimethoxy silane, 1H,1H,2H,2H-perfluorooctyltriethoxy silane, 1H,1H,2H,2H-perfluoroodecyltrimethoxy silane and 1H,1H,2H,2H-perfluorodecyltriethoxy silane, respectively. Daikin Industries' OPTOOL DSX is another commercial product. These compounds are represented by the following general formula:

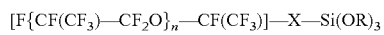
[F{CF(CF$_3$)—CF$_2$O}$_n$—CF(CF$_3$)]—X—Si(OR)$_3$

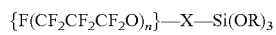
{F(CF$_2$CF$_2$CF$_2$O)$_n$}—X—Si(OR)$_3$   Formula 14 wherein, X is a site at which a perfluoropolyether chain and alkoxy silane residue are bound to each other, and R is an alkyl group.

Synthesis of Compound 1

First, 25% by weight of Dupont's Krytox 157FS-L (average molecular weight: 2500) was dissolved in 100% by weight of 3M's PF-5080, to which 20% by weight of thionyl chloride was added. The mixture was heated under reflux for 48 hours with stirring, and then thionyl chloride and PF-5080 were removed by an evaporator. This produced 25% by weight of acid chloride of Krytox 157FS-L. It was incorporated with 100% by weight of PF-5080, 3% by weight of Chisso's Sila-Ace S330 and 3% by weight of triethyl amine, and the resulting mixture was stirred at room temperature for 20 hours. There action solution was filtered with Showa Chemical Industry's filtration aid RADIOLITE, and PF-5080 was removed from the filtrate by an evaporator. This yielded 20% by weight of Compound 1.

Synthesis of Compound 2

Compound 2 (20% by weight) was synthesized in the same method as was Compound 1, except that 3% by weight of Chisso's Sila-Ace S330 was replaced by 3% by weight of Chisso's Sila-Ace S360.

Synthesis of Compound 3

Compound 3 (30% by weight) was synthesized in the same method as was Compound 1, except that 25% by weight of Dupont's Krytox 157FS-L (average molecular weight: 2500) was replaced by 35% by weight of Daikin Industries' DEMNUM SH (average molecular weight: 3500).

Synthesis of Compound 4

Compound 4 (30% by weight) was synthesized in the same method as was Compound 1, except that 3% by weight of Chisso's Sila-Ace S330 was replaced by 3% by weight of Chisso's Sila-Ace S360 and 25% by weight of Dupont's Krytox 157FS-L (average molecular weight: 2500) was replaced by 35% by weight of Daikin Industries' DEMNUM SH (average molecular weight: 3500).

Synthesis of Compound 5

Compound 5 (3.5% by weight) was synthesized in the same method as was Compound 1, except that 25% by weight of Dupont's Krytox 157FS-L (average molecular weight: 2500) was replaced by 3.5% by weight of Daikin Industries' 7H-dodecafluoropentanoic acid (average molecular weight: 346.06).

Synthesis of Compound 6

Compound 6 (3.5% by weight) was synthesized in the same method as was Compound 1, except that 25% by weight of Dupont's Krytox 157FS-L (average molecular weight: 2500) was replaced by 3.5% by weight of Daikin Industries' 7H-dodecafluoropentanoic acid (average molecular weight: 346.06) and 2% by weight of Chisso's Sila-Ace S310 was replaced by 2% by weight of Chisso's Sila-Ace S320.

Synthesis of Compound 7

Compound 7 (4.5% by weight) was synthesized in the same method as was Compound 1, except that 25% by weight of Dupont's Krytox 157FS-L (average molecular weight: 2500) was replaced by 4.5% by weight of Daikin Industries' 9H-hexadecafluorononanoic acid (average molecular weight: 446.07).

Synthesis of Compound 8

Compound 8 (4.5% by weight) was synthesized in the same method as was Compound 1, except that 25% by weight of Dupont's Krytox 157FS-L (average molecular weight: 2500) was replaced by 4.5% by weight of Daikin Industries' 9H-hexadecafluorononanoic acid (average molecular weight: 446.07) and 2% by weight of Chisso's Sila-Ace S310 was replaced by 2% by weight of Chisso's Sila-Ace S320.

(b) Method for Forming a Liquid-Repellent Film

The method for forming a liquid-repellent film using a perfluoropolyether or perfluoroalkyl compound having an alkyoxy silane group at the terminal is as follows.

First, a perfluoropolyether or perfluoroalkyl compound having an alkoxy silane group at the terminal is dissolved in a solvent. Concentration of the solvent is generally in a range from 0.01 to 1.0% by weight or so, although varying by how the solution is spread. The fluorine-based solvents useful for the present invention include FC-72, FC-77, PF-5060, PF-5080, HFE-7100 and HFE-7200 (3M), and Vertrel (Dupont). Thus, a solution dissolving a perfluoropolyether and perfluoroalkyl compounds is prepared (the solution is hereinafter referred to as liquid-repellent treatment solution).

Next, the antireflection layer is coated with the liquid-repellent treatment solution by a common method, preferably, dip coating. Then, it is heated.

Embodiment of Apparatus Using Display Device of the Invention

Figure 31:
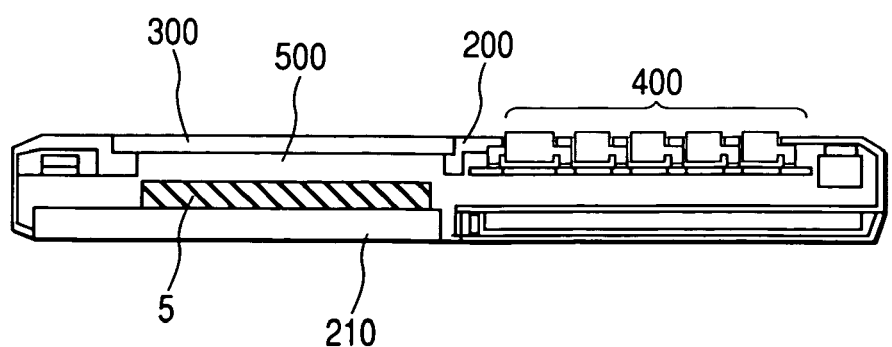
FIG. 31 is a schematic, cross-sectional view of an electrical appliance provided with a display device according to one embodiment of the present invention.
Figure 32:
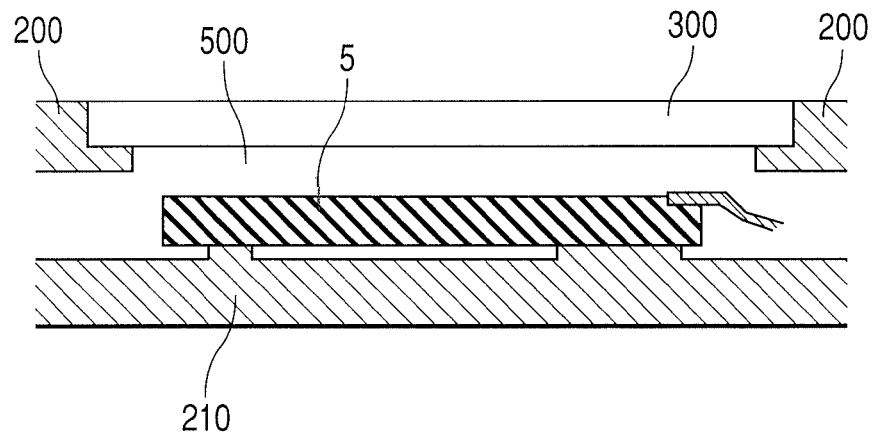
FIG. 32 is a schematic, partial cross-sectional view around the display device installed in an electrical appliance according to the present invention.

The following will now describe an embodiment of an apparatus using the display device of the present invention. FIG. 31 is a schematic, cross-sectional view of such an electrical appliance provided with a display device according to one embodiment of the present invention. FIG. 32 is a schematic, partial cross-sectional view around the display device installed in the electrical appliance.

The electrical appliance includes an input means 400 consisting of a numeric pad, a protection plate 300, a display device 5 and a chassis for protecting and supporting these constituents.

The protection plate 300 is preferably transparent, and has improved crack resistance and superior mechanical strength on its surface. A resin plate made of an acryl resin or a polycarbonate resin may be used as the protection plate 300.

For the display device 5, a liquid crystal display device incorporating the liquid crystal display panel and the backlight device illustrated in the above-described embodiment or an OLED display panel (OLED display device) may be used. If that is the case, an antireflection layer should be deposited on an optical film. In case of using a low reflectance, low refractive index layer, it is virtually impossible to make the layer have hardness or frictional resistance compatible with those of the glass surface. Therefore, the electrical appliance in this embodiment employs the transparent protection plate 300 on the surface of the display device 5, and has voids 500 formed between the protection plate 300 and the display device 5. The protection plate 300 is protected and kept safely inside the chassis 200 on the front surface side of the electrical appliance, and the display device 5 is protected with the chassis 210 on the inside surface side of the electrical appliance.

In this manner, a mechanical force applied from the outside on the front surface side towards an area of the display device is actually applied to the protection plate and the chassises of the electrical appliance, and the surface of the display device is well protected from such force. Therefore, although the display device surface may be coated with a weak antireflection layer, it is possible to prevent unnecessary damages.

What is claimed is:

1. A liquid crystal display (LCD) panel having a first surface positioned for viewing, a second surface positioned opposite to said first surface, and side surfaces, said liquid crystal display panel comprising:
    a first transparent substrate, including said first surface;
    a second transparent substrate, including said second surface positioned opposite to said first surface;
    a liquid crystal layer, sandwiched between said first transparent substrate and said second transparent substrate;
    a first antireflection layer that covers and is in direct contact with a display region of said first surface;
    a second antireflection layer that covers and is in direct contact with said second surface; and
    third, fourth and fifth antireflection layers, each one covering and in direct contact with a respective side surface;
    wherein each of said first, second, third, fourth, and fifth antireflection layers is made of a same material;
    wherein said second transparent substrate is larger in area than said first transparent substrate;
    wherein a semiconductor chip and a flexible printed circuit are mounted on a part of a surface of said second transparent substrate which is not overlapped with said first transparent substrate; and
    wherein an edge surface of said second transparent substrate corresponding to said flexible printed circuit does not have an antireflection layer coating.

2. The liquid crystal display (LCD) panel according to claim 1, wherein each of said antireflection layers includes inorganic oxide particles, a binder, and voids, and has an arithmetic mean roughness (Ra) on one side surface thereof of less than 6 nm.

3. The liquid crystal display (LCD) panel according to claim 2, wherein a surface resistance of each of said antireflection layers is less than $10^{11}\Omega$.

4. The liquid crystal display (LCD) panel according to claim 2, wherein each of said antireflection layers has a liquid-repellent layer; and
    wherein a contact angle between said liquid-repellent layer and water is within a range of 100° and 180°, inclusive.

5. The liquid crystal display (LCD) panel according to claim 2, wherein said binder comprises silica sol.

6. The liquid crystal display (LCD) panel according to claim 1, wherein each of said antireflection layers includes inorganic oxide particles, a binder, and voids, and said binder contains as a main component a same material as said substrate.

7. The liquid crystal display (LCD) panel according to claim 1;
    wherein each of said antireflection layers includes inorganic oxide particles, a binder, and voids; and
    wherein a density of said voids is higher at an interior of an antireflection layer than a surface of the antireflection layer in contact with air.

8. The liquid crystal display (LCD) panel according to claim 1, wherein each side surface is connected to both said first surface and said second surface positioned opposite to said first surface.

9. The liquid crystal display (LCD) panel according to claim 1, wherein the area of said second substrate is larger than the area of said second surface covered by said second antireflection layer.

10. An organic light emitting display (OLED) panel having a first surface positioned for viewing, a second surface positioned opposite to said first surface, and side surfaces, said OLED panel comprising:
    a substrate including a plurality of organic light emitting elements that form a plurality of pixels arranged in a matrix;
    a sealing plate positioned to create a seal with at least a portion of the substrate;
    a first antireflection layer that covers and is in direct contact with said first surface;
    a second antireflection layer that covers and is in direct contact with said second surface; and
    third, fourth and fifth antireflection layers, each one covering and in direct contact with a respective side surface;
    wherein each of said first, second, third, fourth, and fifth antireflection layers is made of a same material;
    wherein said substrate is larger in area than said sealing plate;
    wherein a semiconductor chip and a flexible printed circuit are mounted on a part of a surface of said substrate which is not overlapped with said sealing plate; and wherein an edge surface of said substrate corresponding to said flexible printed circuit does not have an antireflection layer coating.

11. The organic light emitting diode (OLED) display panel according to claim 10, wherein each side surface is connected to both said first surface and said second surface positioned opposite to said first surface.

12. A liquid crystal display (LCD) panel, comprising:
a first transparent substrate;
a second transparent substrate;
a liquid crystal layer sandwiched between said first transparent substrate and said second transparent substrate; and
first, second, third, fourth, and fifth antireflection layers;
wherein said first transparent substrate has a first optical film having at least one polarizing layer deposited on an opposite surface thereof not facing said second transparent substrate;
wherein said second transparent substrate has a second optical film having at least one polarizing layer deposited on an opposite surface thereof not facing said first transparent substrate;
wherein said second transparent substrate is larger in area than said first transparent substrate;
wherein said first transparent substrate and said second transparent substrate define a display region of both substrates as being an area where said first transparent substrate overlaps said second transparent substrate;
wherein said first optical film and said second optical film are each larger in area than said display region;
wherein said second optical film is the same size or a smaller size than said second transparent substrate;
wherein said first antireflection layer covers and is in direct contact with said display region of said first optical film;
wherein said second antireflection layer covers and is in direct contact with said display region of said second optical film;
wherein each of said third, fourth and fifth antireflection layers covers and is in direct contact with a respective side surface of said LCD panel;
wherein each of said first, second, third, fourth, and fifth antireflection layers is made of a same material;
wherein a semiconductor chip and a flexible printed circuit are mounted on a part of a surface of said second transparent substrate which is not overlapped with said first transparent substrate; and
wherein an edge surface of said second transparent substrate corresponding to said flexible printed circuit does not have an antireflection layer coating.

13. The liquid crystal display (LCD) panel according to claim 12,
wherein an electrode forming a plurality of pixels arranged in a matrix is formed on said second transparent substrate; and
wherein a circuit conducts an electrical signal including an image signal, and said circuit connects said electrode to an outside, in which said connection of an electric signal to an outside is executed in a predetermined direction; and
wherein said circuit that conducts an electric signal is overlapped by a region of an optical film area.

14. The liquid crystal display (LCD) panel according to claim 12, wherein each side surface of said LCD panel is connected to both an outer surface of said first transparent substrate and to an outer surface of said second transparent substrate.

15. An organic light emitting display (OLED) panel having a first surface with a display region, a second surface opposite to said first surface with said display region, and a plurality of side surfaces, said OLED panel comprising:
a substrate with a plurality of organic light emitting elements forming a plurality of pixels arranged in a matrix;
a sealing plate positioned to create a seal with at least a portion of said substrate;
an optical film, having at least one polarizing layer, covering a top-most surface of a light out-coupling side of at least one of said substrate with said plurality of organic light emitting elements and said sealing plate; and
first, second, third, fourth, and fifth antireflection layers;
wherein said substrate with said plurality of light emitting elements is larger in area than said sealing plate, and has a display region in a region overlapped by said sealing plate;
wherein said optical film is formed at a surface of one of said substrate or said sealing plate, is larger in area than said sealing plate, and said optical film covers at least a portion of a region where said substrate is not overlapped by said sealing plate;
wherein said first antireflection layer covers and is in direct contact with a surface of said display region of said optical film, said surface of said optical film not being in contact with said substrate or said sealing plate;
wherein said second antireflection layer covers and is in direct contact with a surface of said substrate or said sealing plate, said surface of said substrate or said sealing plate not being in contact with said optical film;
wherein each of said third, fourth and fifth antireflection layers covers and is in direct contact with a respective side surface of said OLED panel;
wherein each of said first, second, third, fourth, and fifth antireflection layers is made of a same material;
wherein said substrate is larger in area than said sealing plate;
wherein a semiconductor chip and a flexible printed circuit are mounted on a part of a surface of said substrate which is not overlapped with said sealing plate; and
wherein an edge surface of said substrate corresponding to said flexible printed circuit does not have an antireflection layer coating.

16. The organic light emitting diode display according to claim 15,
wherein a circuit conducts an electrical signal including an image signal, and connects said plurality of pixels to an outside; and
wherein a portion of said circuit is connected to the substrate having light emitting elements, in which said connection of the electric signal with said outside is executed in a predetermined direction and
wherein said circuit connecting said plurality of pixels to an electric signal to said outside is overlapped with an expanded region of an optical film area.

17. The organic light emitting diode (OLED) display panel according to claim 15, wherein each side surface of said OLED panel is connected to both an outer surface of said substrate and an outer surface of said sealing plate.

* * * * *